United States Patent [19]

Hoffman et al.

[11] Patent Number: 4,722,372

[45] Date of Patent: Feb. 2, 1988

[54] ELECTRICALLY OPERATED DISPENSING APPARATUS AND DISPOSABLE CONTAINER USEABLE THEREWITH

[75] Inventors: Louis S. Hoffman, Morristown; William Bohmer, Flanders; Ralph J. DeVito, Bound Brook; Brian R. Langille, Great Meadows; Richard D. Watkins, Whippany; Charles B. Sanders, Cedar Grove; Martha E. Kerch, Flanders, all of N.J.

[73] Assignee: Louis Hoffman Associates Inc., Randolph, N.J.

[21] Appl. No.: 762,126

[22] Filed: Aug. 2, 1985

[51] Int. Cl.⁴ .............................................. B67D 5/60
[52] U.S. Cl. ...................................... 141/98; 141/351; 4/623; 250/221; 222/214; 222/52; 417/478; 137/562
[58] Field of Search .................... 141/1, 98, 94, 348, 141/351, 83, 360–362, 114; 4/623, 304, 313; 222/52, 62, 207, 212, 213, 214; 137/562; 250/221; 417/478, 479; 128/205.18, 205.13

[56] References Cited

U.S. PATENT DOCUMENTS

| | | | |
|---|---|---|---|
| 2,387,359 | 10/1945 | Scarry | 222/52 |
| 2,647,661 | 8/1953 | Harvey | 222/68 |
| 3,001,557 | 9/1961 | Kückens | 141/361 |
| 3,066,832 | 12/1962 | Rossetti | 222/214 |
| 3,273,752 | 9/1966 | Horeczky | 222/52 |
| 3,327,901 | 6/1967 | Yerkovich | 222/52 |
| 3,419,188 | 12/1968 | Matchett | 222/52 |
| 3,480,787 | 11/1969 | Johansen | 250/221 |
| 3,491,381 | 1/1970 | Cathcart | 4/623 |
| 3,518,033 | 6/1970 | Anderson | 417/478 |
| 3,543,662 | 12/1970 | Erlichman | 354/202 |
| 3,576,277 | 4/1971 | Blackmon | 222/1 |
| 3,587,425 | 6/1971 | Biber | 354/126 |
| 3,639,920 | 2/1972 | Griffin et al. | 4/623 |
| 3,679,331 | 7/1972 | Kushner | 417/477 |
| 3,741,439 | 6/1973 | Vehrs | 222/103 |
| 3,818,806 | 6/1974 | Fumagalli | 128/205.13 X |
| 3,870,201 | 3/1975 | Asplund | 222/207 |
| 3,990,848 | 11/1976 | Corris | 422/49 |
| 4,015,914 | 4/1977 | Kushner et al. | 417/478 |
| 4,042,153 | 8/1977 | Callahan et al. | 222/207 |
| 4,130,224 | 12/1978 | Norman et al. | 222/185 |
| 4,210,136 | 7/1980 | Apple | 128/205.18 X |
| 4,215,689 | 8/1980 | Akiyamu et al. | 417/478 X |
| 4,350,268 | 9/1982 | Potter | 222/214 |
| 4,360,324 | 11/1982 | Ohara et al. | 417/478 X |
| 4,381,022 | 4/1983 | Medynski | 141/351 X |
| 4,394,938 | 7/1983 | Frassanito | 222/207 |
| 4,398,310 | 8/1983 | Lienhard | 4/623 |
| 4,515,294 | 5/1985 | Udall | 222/105 |
| 4,573,612 | 3/1986 | Maddison et al. | 222/94 |
| 4,601,411 | 7/1986 | van Overbruggen | 222/207 |

FOREIGN PATENT DOCUMENTS

| | | |
|---|---|---|
| 78181 | 5/1983 | European Pat. Off. |
| 110686 | 6/1984 | European Pat. Off. |
| 127497 | 12/1984 | European Pat. Off. |
| 2016862 | 5/1970 | France |

*Primary Examiner*—Henry J. Recla
*Assistant Examiner*—Ernest G. Cusick
*Attorney, Agent, or Firm*—Caesar, Rivise, Bernstein, Cohen & Pokotilow, Ltd.

[57] ABSTRACT

Electrical batteries are integrated with a disposable container of flowable material for powering a dispensing apparatus. The disposable container includes a deformable chamber for containing a predetermined quantity of material to be dispensed, and an electrically energized actuating member deforms the chamber for dispensing the flowable material. The dispensing apparatus is actuated by a photocell system which electrically energizes the actuating member in response to the proximity of a user to the dispensing apparatus without the user contacting the apparatus. The photocell system normally is inactive, and is rendered active by a sensor for detecting the proximity of a user to the apparatus.

21 Claims, 26 Drawing Figures

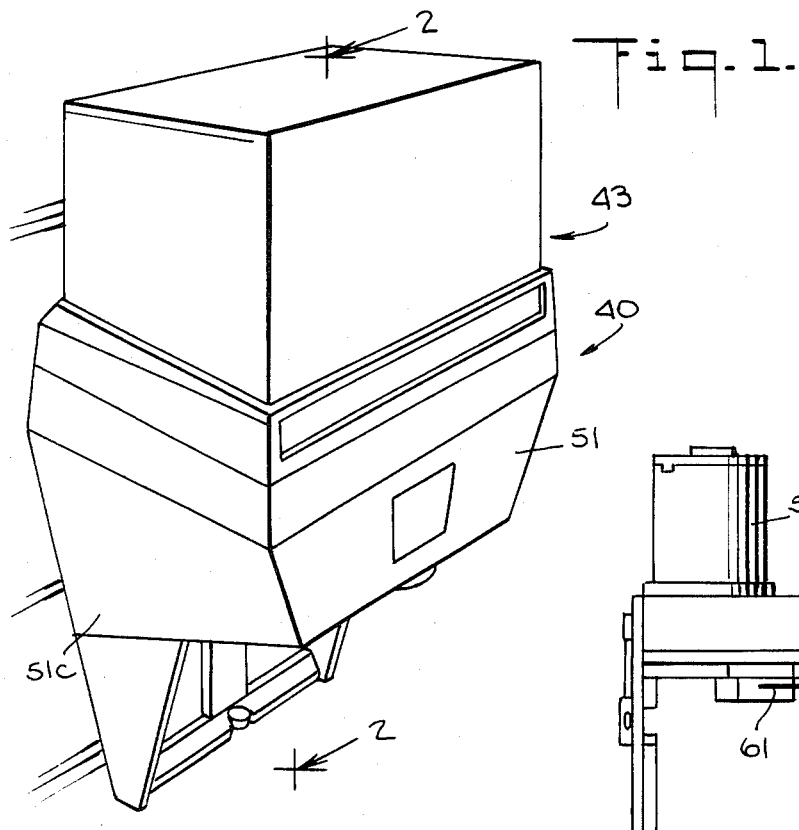
Fig. 1.
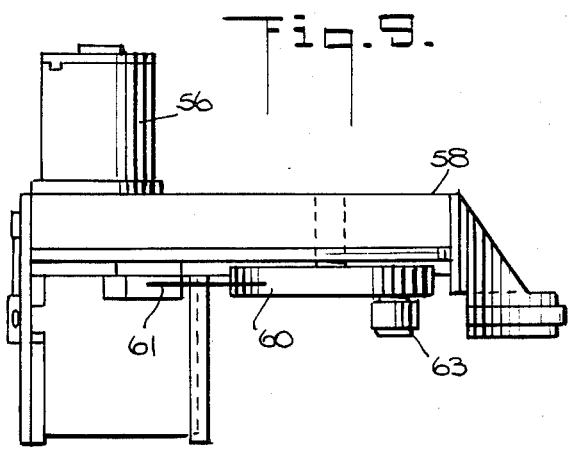
Fig. 9.
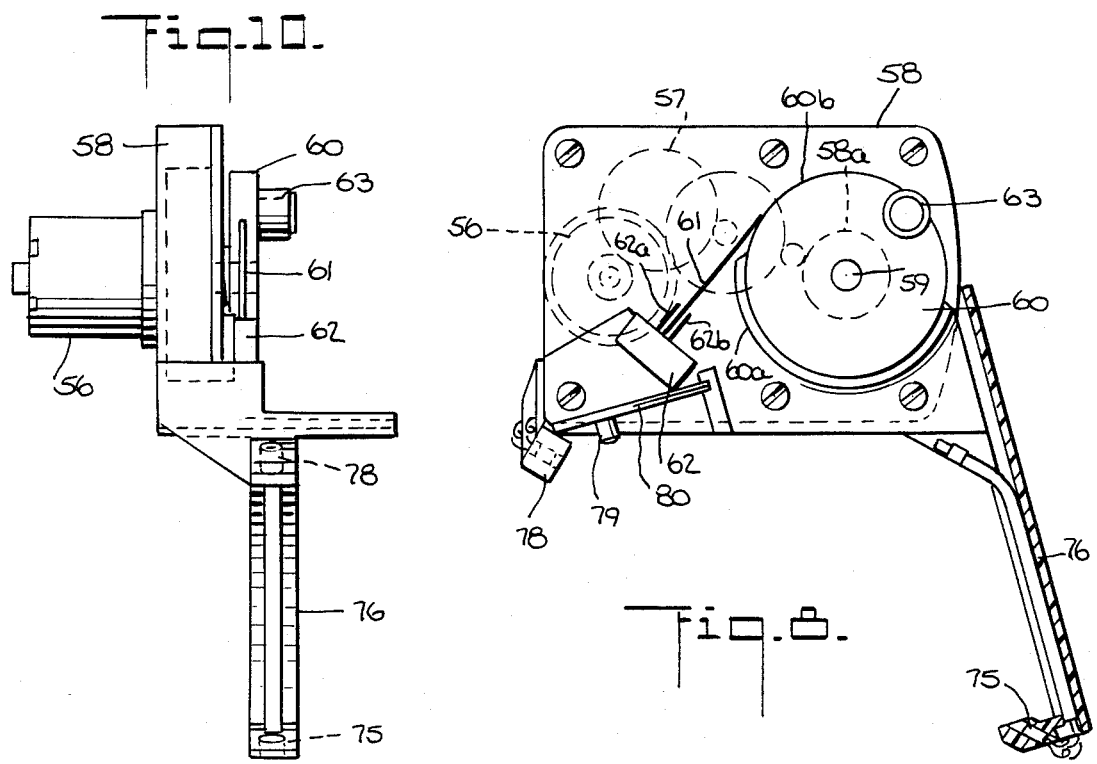
Fig. 10.
Fig. 8.

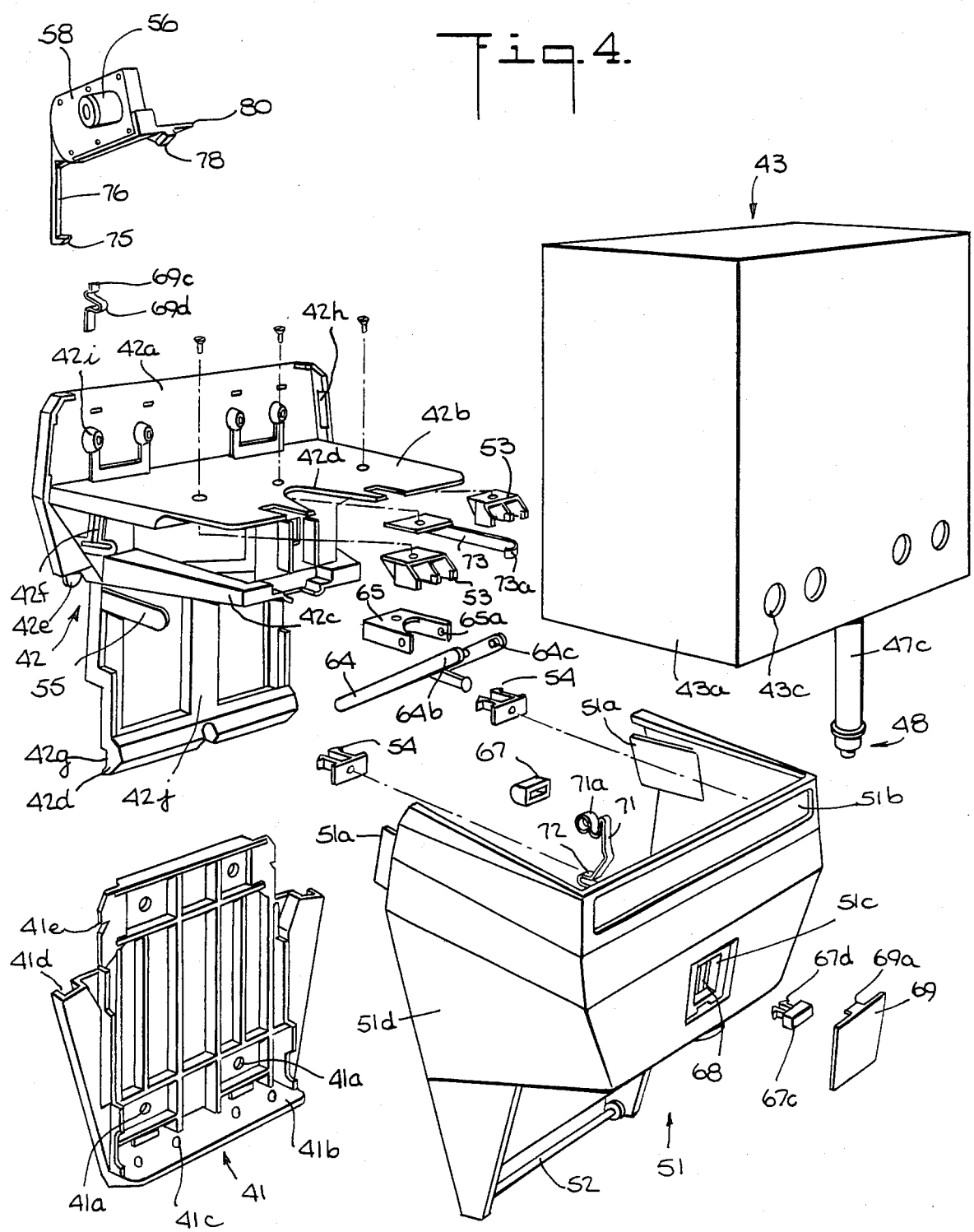

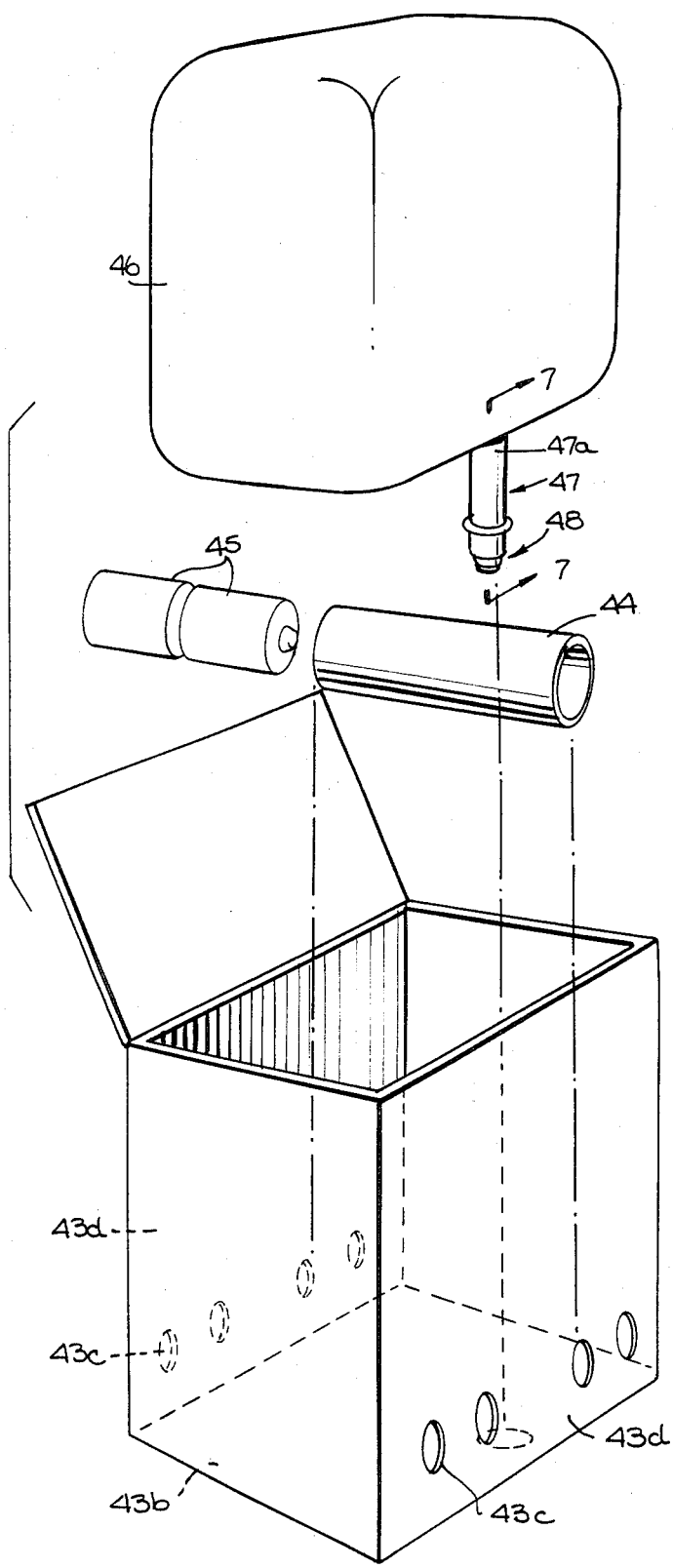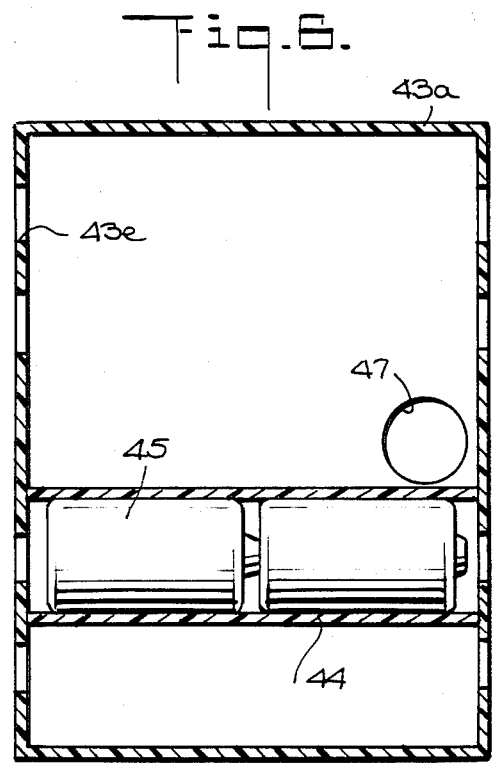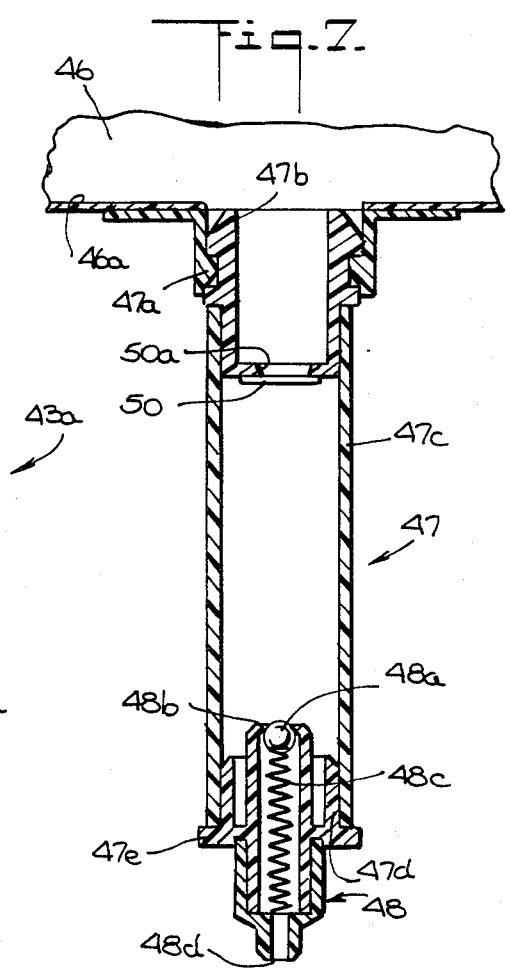

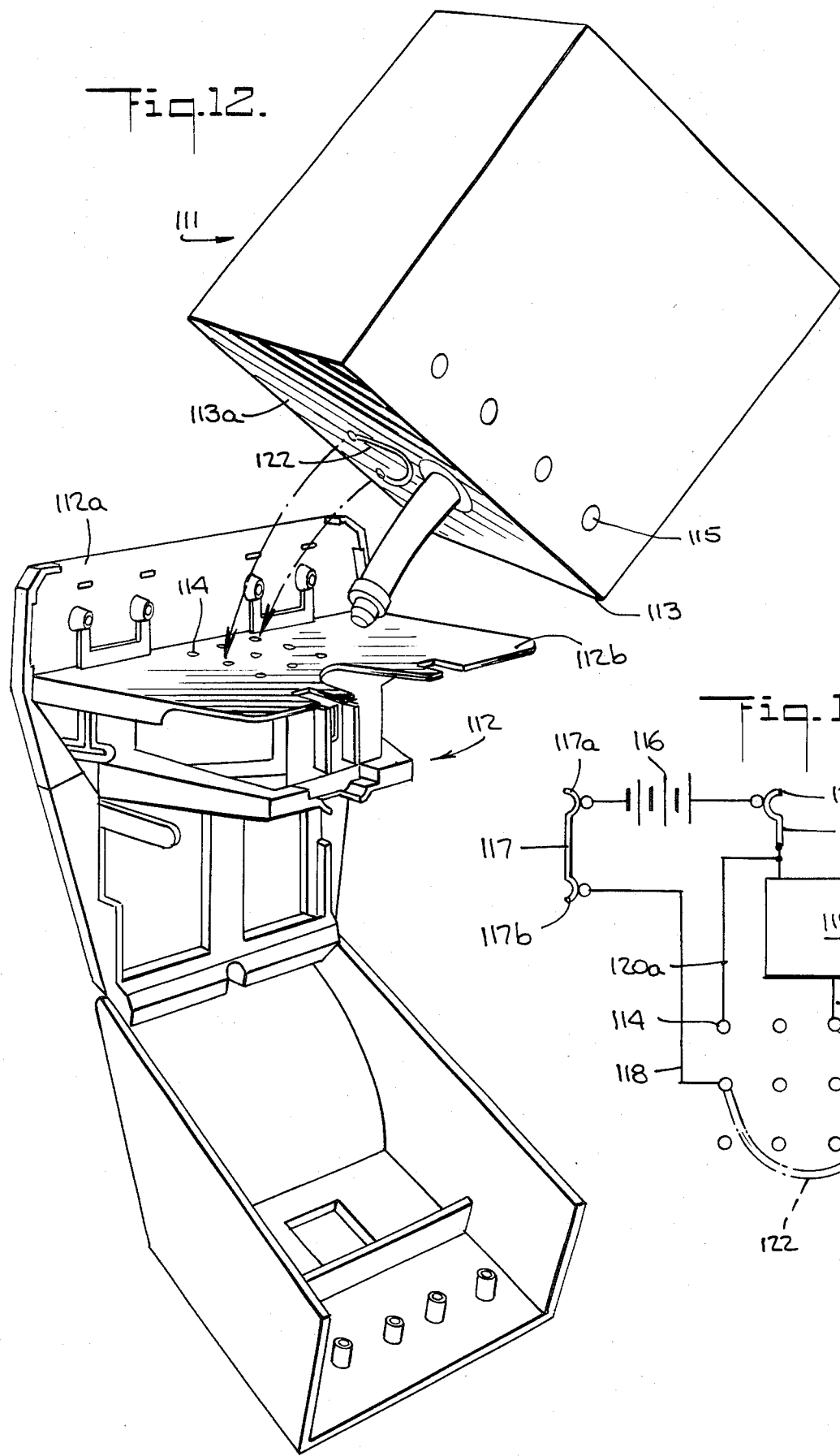

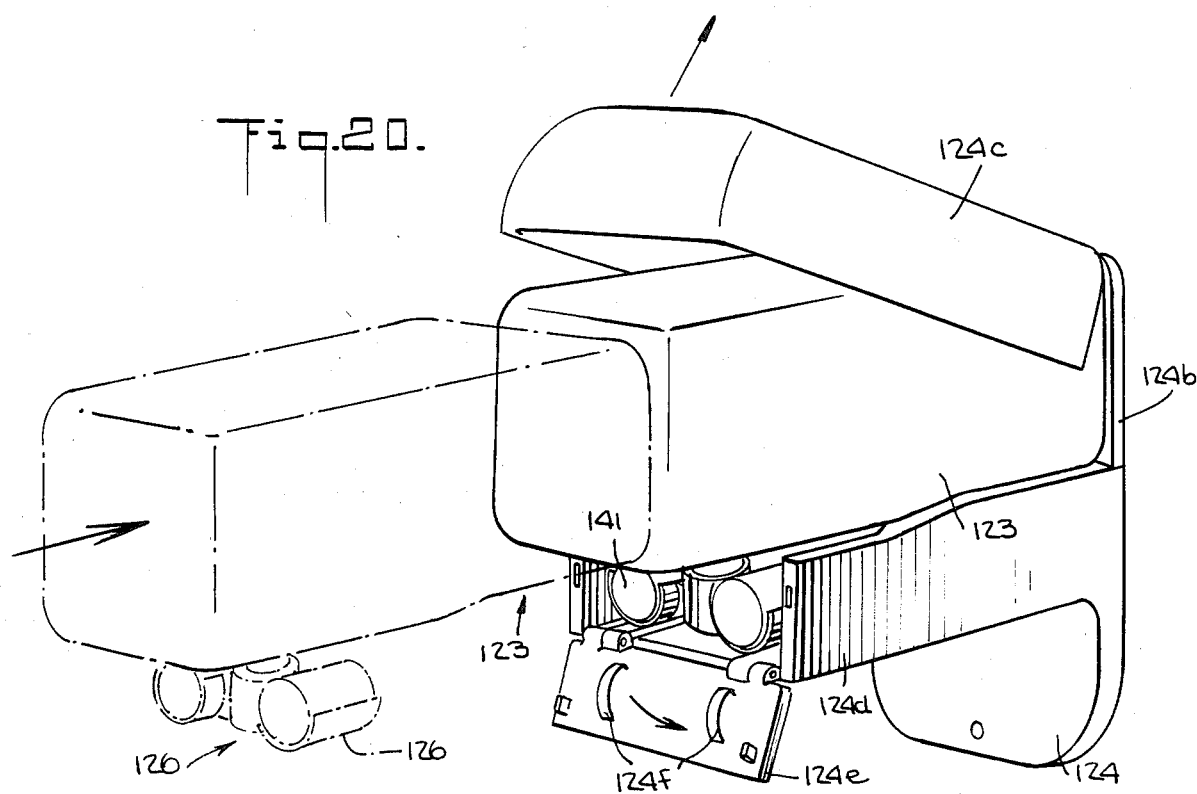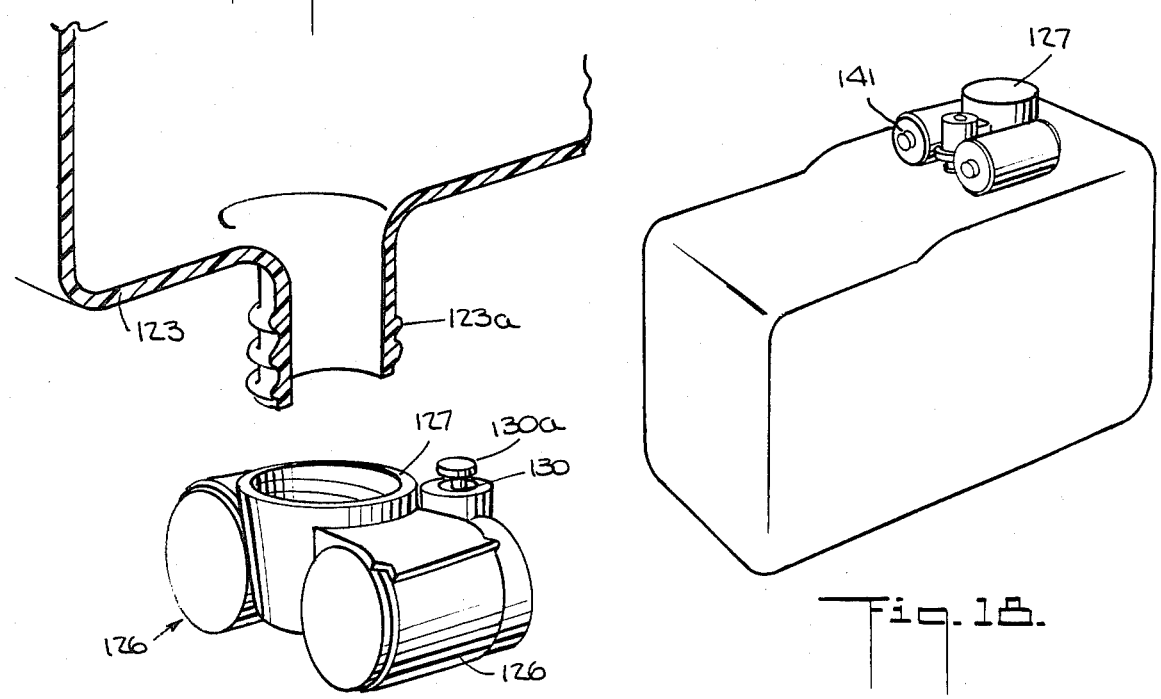

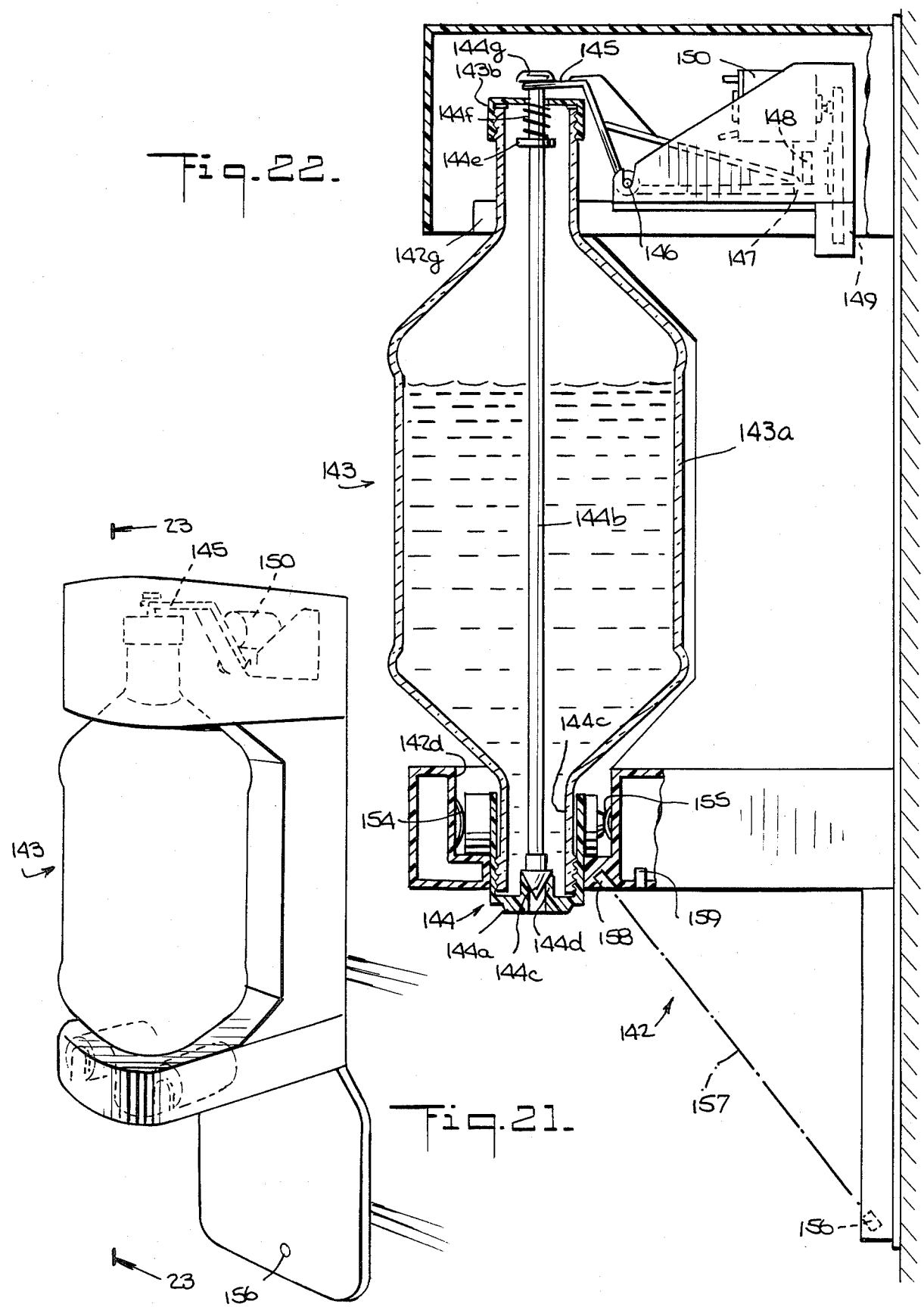

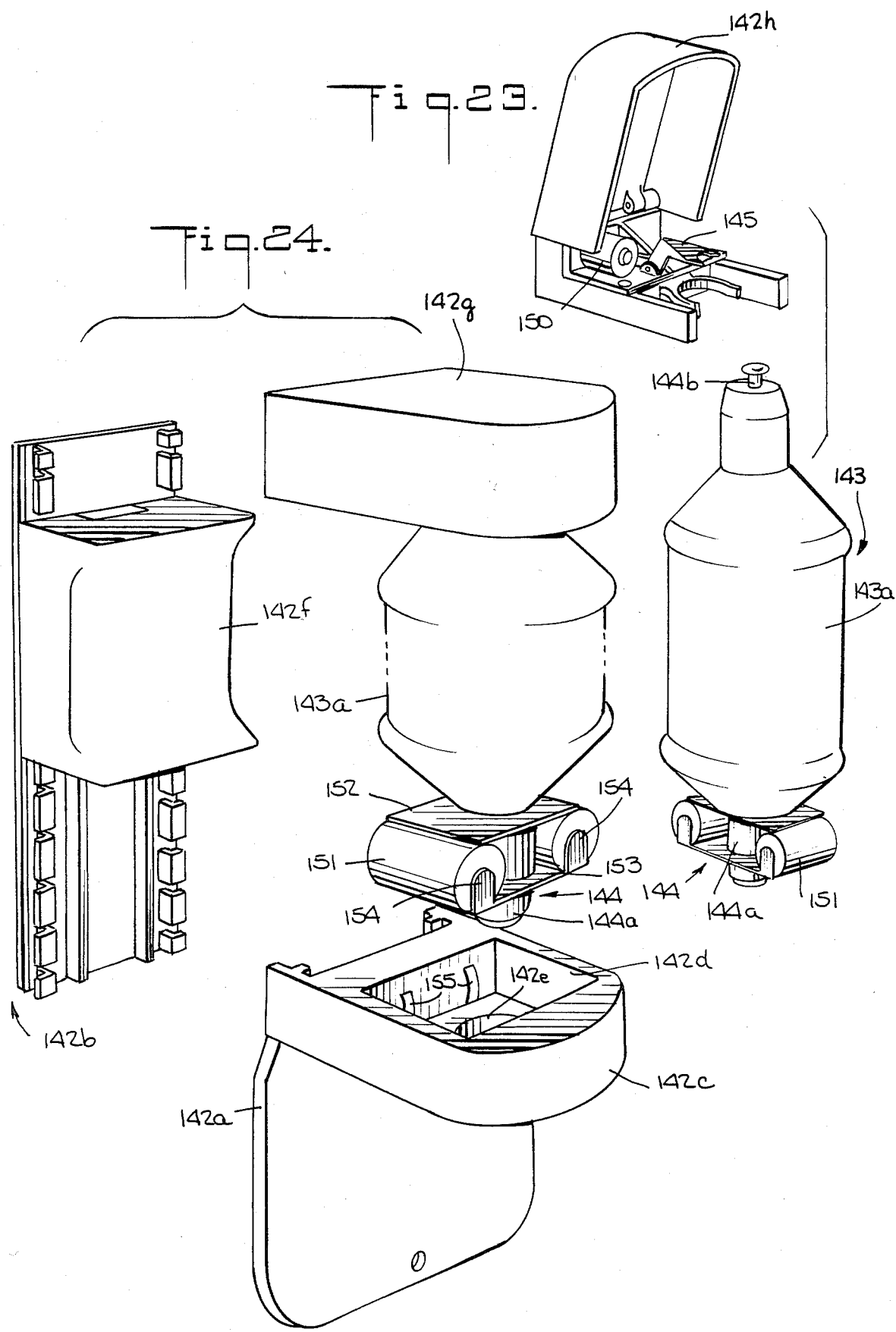

ELECTRICALLY OPERATED DISPENSING APPARATUS AND DISPOSABLE CONTAINER USEABLE THEREWITH

BACKGROUND OF THE INVENTION

1. Field of the Invention

The invention relates to a method and apparatus for dispensing flowable material from a disposable container. More in particular, the invention relates to the dispensing of a liquid material such as liquid soap from a disposable container. The disposable container is provided with means for releasing a predetermined amount of flowable material when the releasing means is actuated. The disposable container is also provided with an electrical battery integrated with the container for powering a dispensing apparatus. The invention further relates to the actuation of a dispensing apparatus in response to the proximity of a user to the dispensing apparatus without contact therewith.

2. Description of the Prior Art

U.S. Pat. No. 3,162,340 of Erickson shows a liquid dispenser having a low cost liquid container of one-piece molded plastic construction. Liquid flow is controlled by a solenoid valve in the dispensing apparatus.

U.S. Pat. No. 3,639,920 of Griffin et al. shows a dispenser for liquid soap in combination with a plumbing fixture in which the presence of a user as sensed by a photocell initiates the dispensing of liquid soap.

Each of U.S. Pat. No. 3,491,381 of Cathcart, U.S. Pat. No. 3,576,277 of Blackmon, U.S. Pat. No. 3,670,167 of Forbes, and U.S. Pat. No. 4,398,310 of Lienhard show a system in which a photocell senses the approach of a user to initiate the flow of water for a hand-washing device.

U.S. Pat. No. 3,480,787 of Johansen also shows the control of flow from a faucet by means of a light source and a photo-responsive element which senses the presence of the user's hands adjacent the faucet.

U.S. Pat. No. 3,327,901 of Yerkovich shows a photocell which in response to the presence of the user's hands actuates a pump which dispenses liquid material such as soap from the dispenser.

U.S. Pat. No. 3,741,439 of Vehrs, U.S. Pat. No. 3,870,201 of Asplund, and U.S. Pat. No. 4,130,224 of Norman et al. shows a dispensing apparatus in which a reservoir is provided with a resilient tube having a check valve at the lower end thereof. A block when moved by a yieldable arm against the tube pinches off the upper portion of the tube and then collapses the portion of the tube therebeneath to discharge a viscous liquid through the valve.

SUMMARY OF THE INVENTION

An object of the invention is to provide an apparatus for dispensing flowable material in which the material is dispensed from a disposable container having means integrated with the container for releasing a predetermined amount of the material when the releasing means is actuated.

Another object of the invention is to provide apparatus for dispensing flowable material when electrically energized.

An additional object of the invention is to provide a dispensing apparatus in which the disposable container is provided with an elongated chamber for releasing a predetermined amount of material when deformed to decrease the volume therein.

A further object of the invention is to provide a disposable container having an electrical power source integrated therewith.

It is also an object of the invention to provide an apparatus for dispensing flowable material in which the releasing of material to be dispensed is in response to the proximity of a user to the dispensing apparatus without the user contacting the dispensing apparatus.

In the preferred embodiment of the invention, the apparatus for dispensing flowable material comprises a disposable container such as a bag in a casing for holding material to be dispensed. Means such as a valve is integrated with the container for releasing a predetermined amount of flowable material when the valve is actuated. The apparatus further includes means when electrically energized for actuating the releasing valve to release the predetermined amount of material.

The disposable container of the invention further comprises an elongated chamber having a releasing valve disposed at an opening therein for releasing material and a check valve disposed at the opposite end thereof for blocking a flow of material between the chamber and the container. The means for actuating the releasing means comprises means for displacing the deformable wall portion of the elongated chamber to increase the pressure therein, thereby enabling the material to be released through the releasing valve.

Further in accordance with the invention, the disposable container comprises at least one receptacle for receiving at least one electrical power source to energize the dispensing apparatus.

Also in accordance with the invention, there is a plurality of different available positions for the receptacles with each different position of a receptacle corresponding to a different material to be dispensed.

The invention also comprises means for activating the means for actuating the releasing means with electrical energy in response to the proximity of a portion of the body of a user without the portion of the body contacting the dispensing apparatus. The means for actuating the releasing means includes means for sensing electromagnetic radiation applied thereto and means responsive to a change in electromagnetic radiation applied to the sensing means when a portion of the body of a user is approximate to the dispensing apparatus without contacting the dispensing apparatus.

In addition, the invention comprises means for detecting a change in the ambient light applied thereto when a user is proximate to the dispensing apparatus without the user contacting the apparatus. The detecting of the change in ambient light by the detecting means enables the means for activating the means for actuating the releasing means.

BRIEF DESCRIPTION OF THE DRAWINGS

FIG. 1 is a perspective view of the exterior of the dispensing apparatus of the invention;

FIG. 4 is an exploded perspective view showing the mounting adapter, support plate, means for actuating the releasing valve, the disposable container and the cover of the dispensing apparatus;

FIG. 5 is an exploded perspective view showing the disposable container, receptacles adjacent thereto for receiving batteries, and a casing;

FIG. 6 is a horizontal section of the casing for the disposable container showing one of the plurality of the optional locations for the receptacle for receiving the batteries of the dispensing apparatus;

FIG. 7 is a fragmentary vertical section of the releasing valve taken along the line 7—7 in FIG. 5 of the disposable container showing the check valve at the lower portion thereof;

FIG. 8 is a front elevation view of the means for actuating the releasing valve;

FIG. 9 is a plan view of the means for actuating the releasing valve;

FIG. 10 is a side elevation view of the means for actuating the releasing valve;

FIG. 12 is a perspective view of the dispensing apparatus showing a plurality of contacts on the upper support plate which are adapted to engage a conductive pattern on the disposable container;

FIG. 13 is a schematic view showing the contacts of the plurality of contacts of the dispensing apparatus in circuit with the conductive pattern of the casing of the disposable container;

FIG. 18 is a perspective view of the disposable container of the embodiment of the dispensing device shown in FIG. 14 including the receptacles for batteries;

FIG. 19 is a fragmentary perspective view partially in section showing the assembly of a valve and receptacles for batteries for the disposable container;

FIG. 20 is a perspective view showing the dispensing apparatus of FIG. 14 receiving a disposable container with releasing valve and batteries;

FIG. 21 is an additional embodiment of the dispensing apparatus of the invention in which the releasing valve is operated from the upper portion of the disposable container;

FIG. 22 is a vertical section view showing the releasing valve and the means for actuating the releasing valve;

FIG. 23 is a perspective view showing the disposable container, the means for actuating the releasing valve, the cover of the dispensing apparatus shown in FIG. 14;

FIG. 24 is an exploded perspective view of the apparatus of FIG. 21;

DESCRIPTION OF THE INVENTION

Figure 2:
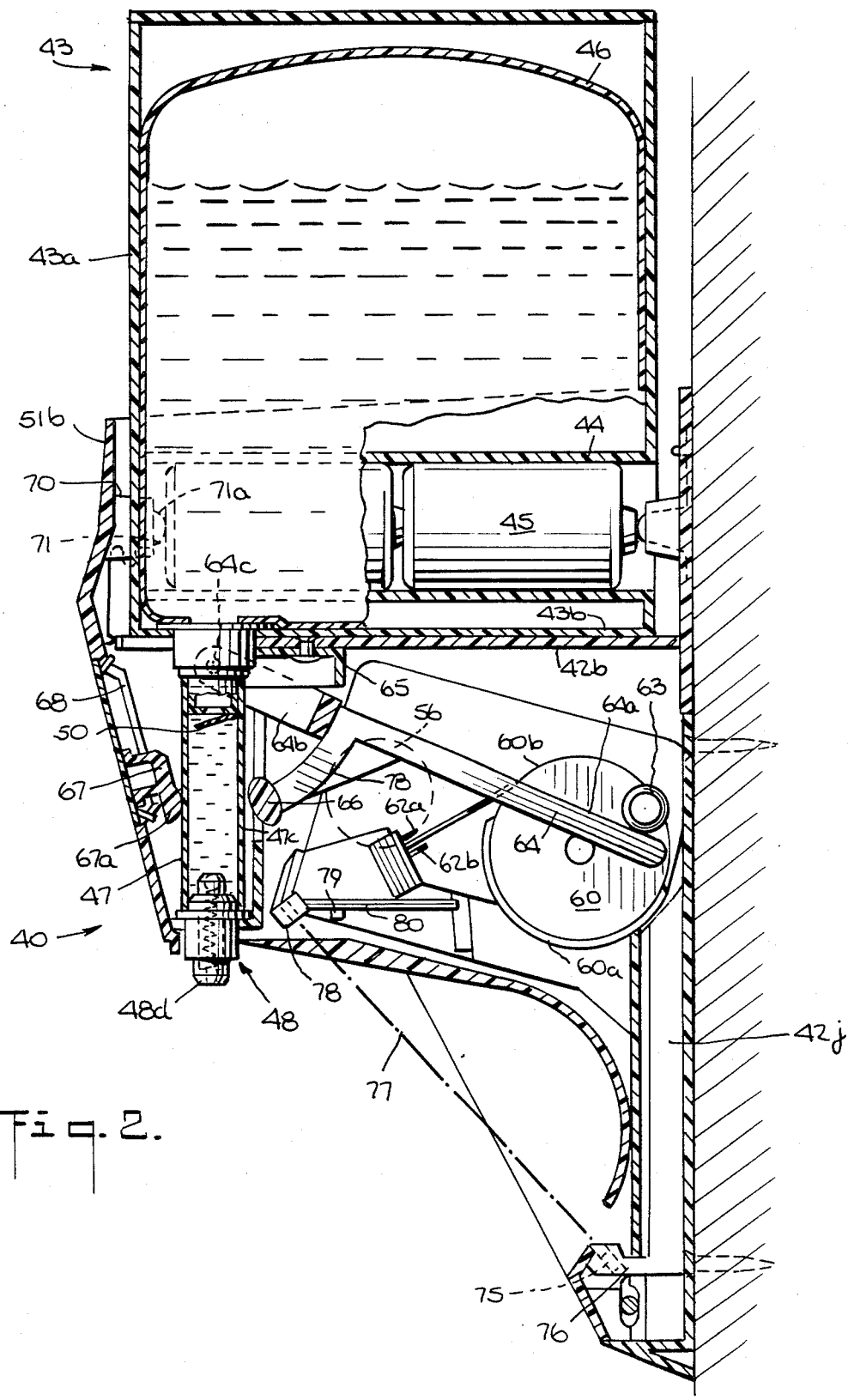
FIG. 2 is a vertical section taken along the line 2—2 in FIG. 1 and showing the disposable container, its releasing valve, and means for actuating the releasing valve.

As shown in FIG. 4 dispensing apparatus 40 comprises adapter 41 for mounting the apparatus on a vertical surface such as a wall. Holes 41a enable the adapter to be mounted by screws extending therethrough into a wall. Support 42 comprises vertical plate 42a, upper horizontal plate 42b, and lower horizontal plate 42c. When support 42 is installed with respect to adapter 41, 42d engages lip 41b of the adapter with studs 41c engaging mating openings (not shown) at the bottom portion of rib 42d to secure the support with respect to the adapter. Lugs 42e engage channels 41d to secure the support with respect to the upper portion of the adapter. Latches 42f of the support enter notches 41e of the adapter to prevent removal of the support from the adapter once it is installed unless the latches are released.

Disposable container assembly 43 comprises housing or casing 43a. As shown in FIGS. 5 and 6, one or more of receptacles or tubes 44 extend laterally with respect to the bottom portion 43b of the housing, parallel to one another. Openings 43c in the walls 43d of the casing 43a provide access to the interior of receptacles 44. As shown in FIGS. 5 and 6, a given receptacle 44 can be positioned within housing 43a in alignment with any one of four pairs of openings 43c. In the alternative, receptacles 44 can be placed at more than one pair of the aligned openings 43c.

In order to energize the dispensing apparatus of the invention, electrical batteries 45 such as primary or dry-cell batteries are disposed within each receptacle 44. As shown in FIGS. 5 and 6, a pair of batteries 45 are disposed in one receptacle and a single receptacle is disposed in housing 43a. If the dispensing apparatus is to be energized by a pair of batteries 45 in one receptacle, it can be understood that with the arrangement shown in FIGS. 5 and 6 there are four optional positions for a single receptacle 44.

In the case where it is intended that the position of the receptacle within the casing and thereby the source of electrical energy for the dispensing apparatus be in a predetermined position for a given dispenser container assembly, four different positions are available. It therefore can be seen that a different one of the four positions can be related to a different type of material that is to be provided by disposable container 46. Accordingly the different available positions enable a given dispensing apparatus to operate with only one of a plurality of container assemblies having different battery locations.

As shown in FIGS. 2 and 5, disposable container 46 is adapted to be formed of resin material either in flexible or rigid form; however, the preferred embodiment is for container 46 to be a flexible bag of resin material. The disposable container 46 is placed in casing 43a in which it is supported by bottom portion 43b and by engagement with receptacle 44 within the casing. As shown in FIG. 5, disposable container 46 includes structure forming in elongated chamber 47 connected at end portion 47a thereof to the bottom portion of the disposable container 46. The elongated chamber 47 is of flexible or deformable material of a resilient nature and can be formed from tubular resin material. In FIG. 7, it can be seen that flange 47a is connected to the bottom portion 46a of the disposable container and supports coupling 47b therein. Deformable wall portion 47c of the elongated chamber which can be tubular in form has a lower end portion 47d. Bushing 47e is mounted in the lower end portion 47d and supports check valve 48 which includes ball 48a, urged against seat 48b by spring 48c. If the pressure within elongated chamber 47 is increased to a predetermined level, the resulting downward force applied to ball 48a is sufficient to overcome the upward closing force determined by the spring 48c. As a result, ball 48a will then commence to open at the predetermined pressure, thereby initiating the release of material to flow through port 48d of the check valve.

Further as shown in FIG. 7, coupling 47b supports check valve 50 which can be in the form of a flapper valve. The flapper valve which can be of resilient material, such as elastomeric material, is adapted to close opening 50a whenever the pressure within the elongated chamber 47 is greater than the pressure within the interior of the disposable container 46. Thus, the check valve 50 while permitting flow to occur in a downward direction from disposable container 46 will block any upward flow toward the container.

As shown in FIG. 4, disposable container assembly 43 is adapted to be supported on upper horizontal plate 42b with elongated chamber 47 extending through notch 42d when disposable container assembly 43 is in place on upper horizontal plate 42b of the support. Cover assembly 51 can then be installed.

Cover assembly 51 is provided with hinge pin 52 which is adapted to be disposed behind rib 42d in slot 42g of support 42 (FIG. 4). Thus, the cover assembly 51 is pivotally supported with respect to support 42. When the cover assembly is rotated in a counterclockwise direction as shown in FIG. 4, projections 51a enter slots 42h in the support. Upper horizontal plate 42b supports receptacles 53 which are mounted adjacent the lower surface of the upper horizontal plate. Front 51b of the cover assembly supports hooks 54. Upon moving the cover assembly in a counterclockwise direction about hinge pin 52 as viewed in FIG. 4, hooks 54 engage receptacles 53 and secure the cover assembly 51 in a closed position with respect to support 42. In order to open the cover assembly 51, that is to move the cover assembly in a clockwise direction as viewed in FIG. 4, finger 55 is urged inwardly, thereby freeing the internal surface of side portion 51d from finger 55. The cover assembly can then be moved slightly upwardly with hinge pin 52 traveling vertically in slot 42g. This movement enables the hooks 54 to move above receptacles 53, thereby freeing the hooks from engagement with the receptacles and enabling the cover assembly to be opened.

In FIG. 2, there is shown the means when electrically energized for actuating the releasing means, check valve 48, to release a predetermined amount of material from elongated chamber 47. The actuating means includes motor 56 (FIG. 9) which drives gears 57 within gear box 58 (FIG. 8). The output driven gear 58a is coupled to shaft 59 upon which cam 60 is mounted. Cam 60 has high peripheral portion 60a and low peripheral portion 60b. Follower 61 of leaf switch 62 rides on the high and low portions of cam 60 as the cam is rotated. When follower 61 is on the high portion 60a, follower 61 causes contact 62b to connect to contact 62a. When the follower is on the low portion 60b of cam 60, follower 61 enables contact 62b to open with respect to contact 62a of the leaf switch.

Figure 3:
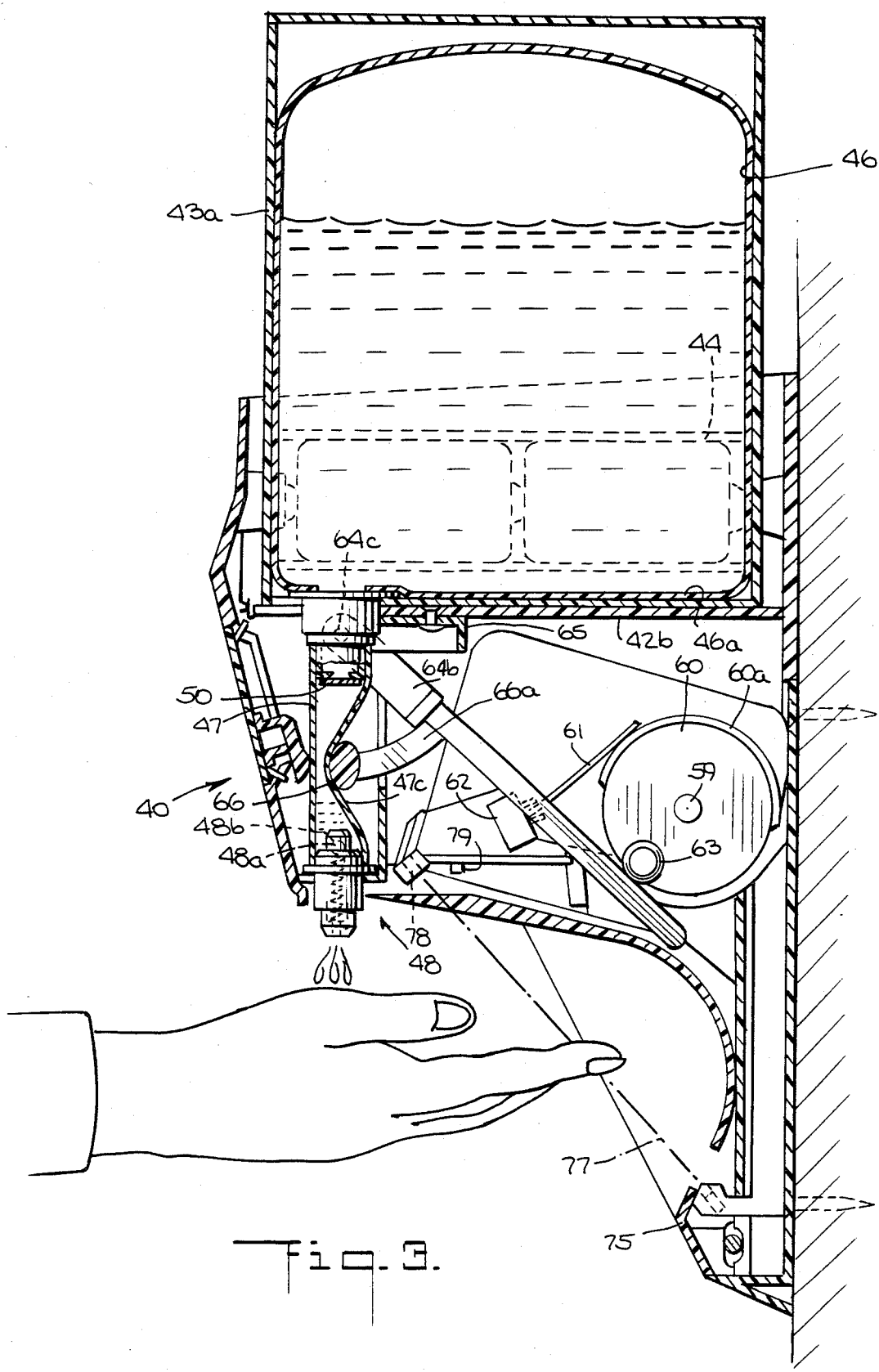
FIG. 3 is a vertical section showing the dispensing of a predetermined amount of liquid material from the chamber of the disposable container in response to the actuating means.

Cam 60 carries pivotally mounted roller 63. As shown in FIG. 2, roller 63 engages upper surface 64a of lever 64. As shown in FIG. 4, lever 64 is pivotally mounted at the end thereof 64b by pins 64c which engage sockets 65a in support 65, mounted upon the lower surface of upper horizontal plate 42b. The means for displacing the deformable wall portion 47c of the elongated chamber 47 comprises pad 66 mounted on lever 64 by arm 66a. As cam 60 rotates in a clockwise direction as shown in FIG. 2, roller 63 engaged with upper surface 64a of lever 64 moves the lever in a clockwise direction. As a result, pad 66 advances to the left as shown in FIG. 3 and deforms the wall portion 47c of the elongated chamber 47. The decrease in the volume within the elongated chamber 47 with the upper portion of the chamber closed by check or flapper valve 50 causes the pressure to increase within the chamber. When ball 48a of check valve 48 is urged downwardly and off seat 48b, flow of material takes place through the check valve.

As cam 60 advances in a clockwise direction beyond the position shown in FIG. 3, roller 63 enables lever 64 to commence movement toward the rest position shown in FIG. 2. At this point, follower 61 drops from the high portion 60a of the cam to the low portion 60b of the cam. As shown in FIG. 2, when the follower 61 is on the low portion 60b of the cam, the follower opens contact 62b with respect to contact 62a of leaf switch 62. This places the motor under the control of circuit 74 of FIG. 11 for ultimate electrical energizing of the motor. When the cam is rotated in a clockwise direction as view in FIG. 2, follower 61 will move on to high portion 60a in which follower 61 connects contact 62b to contact 62a. When the cam moves clockwise from the position shown in FIG. 3, follower 61 subsequently drops on to low portion 60b, thereby opening contacts 61a and 61b. Thereafter, the rotational momentum of the motor 56, gears 57 and cam 60 cause the cam to continue to move toward the rest position shown in FIG. 2 in which follower 61 is engaged with the low portion 60b. The movement of the cam to the rest position shown in FIG. 2 is assisted by the engagement therewith of the upper portion 64a of lever 64. Thus, pad 66 is urged in a counterclockwise direction as viewed in FIGS. 2 and 3 in moving from the position in FIG. 3 to that in FIG. 2 in response to the elastic forces of deformable wall portion 47c.

When the elongated chamber returns to its rest condition shown in FIG. 2, the pressure therein is reduced with the result that check valve 48 closes, thereby terminating the dispensing of material from disposable container 46. At the same time, the reduction in pressure within the elongated chamber 47 enables flow to pass downwardly past flapper valve 50, thereby replenishing the material which is to be subsequently dispensed from the elongated chamber.

As shown in FIG. 2, block 67 having rounded portion 67a is slidably mounted on parallel tracks 68 which are disposed in opening 51c of front portion 51b of the cover assembly 51 (FIG. 4). Clip 67c has hooks 67d which extend between tracks 68 and engage block 67 to secure it in place. Block 67 comprises means adjustably mounted adjacent the deformable wall portion 47c for limiting the change in the volume of the elongated chamber 47 in response to the deforming of the deformable wall portion. In FIG. 2, block 67 is shown in its maximum downward position. In this position, the minimum of movement of pad 66 by the movement of lever 64 in a clockwise direction will displace or deform wall portion 47c of the elongated chamber 47 until it is adjacent block 67. As a result, the pressure within the elongated chamber beneath the location of the block and pad will rapidly reach a pressure enabling flow to take place through check valve 48. In this position of block 67, the maximum amount of material is released.

In the alternative, if block 67 is moved upwardly along track 68 to its uppermost position adjacent flapper valve 50, the block will be displaced from the location along the elongated chamber in which the deformable wall portion 47c is displaced by pad 66. In this condition, the increase in pressure within the elongated chamber beneath the location of pad 66 will be at a reduced rate and accordingly the point at which the flow can be initiated through check valve 48 will be delayed. In this way, the amount of material to be dispensed is reduced to a minimum amount. As shown in FIG. 4, there is provided cover 69 having tabs 69a for retaining the cover with an opening 51c in order to mask the opening and to prevent unauthorized adjustment of block 67.

Support 42 at vertical plate 42a is provided with a contact 69c having a U-shaped portion 69d which extends through a predetermined one of a plurality of hollow bosses 42i mounted upon the vertical plate. Contact 69c is disposed in the leftmost boss 42i of the arrangement of four bosses shown in FIG. 4. The leftmost boss corresponds to a Code 1 position for the leftmost receptacle 44. Thus, the U-shaped portion 69d of contact 69c when disposed in hollow boss 42i is selected to be in alignment with one of the different optional positions of receptacles 44 within housing or casing 43a of the disposable container assembly 43. Since the leftmost receptacle 44 is to be used as shown in FIG. 4 as identified by the position of openings 43c, contact 69c is in circuit with the battery or batteries within the leftmost receptacle 44. Thus, the selection of the location of contact 69c and receptacle 44 enable the dispensing apparatus to be coded to a specific disposable container assembly.

Front portion 51b of cover assembly 51 as shown in FIG. 2 is provided with a plurality of hollow bosses 70 which are in alignment respectively with the hollow bosses 42i when the cover assembly is installed. One of the hollow bosses 70 carries a contact 71 which is in alignment with contact 69c. The U-shaped portion 71a of contact 71 is adapted to connect electrically to battery 45 within receptacle 44 of the predetermined one of the four locations within housing or casing 43a of the disposable container assembly 43.

Contact 72 shown in FIG. 4 which is connected to battery contact 71 engages end 73a of contact 73 when cover assembly 51 is closed. Contact 73 is mounted on the lower surface of horizontal plate 42b. When the cover assembly 51 is to be opened by first being moved slightly upwardly before being rotated in a clockwise direction as shown in FIG. 4, The upward movement releases hook 73 from slot 72a of contact 72. In this way, the electrical circuit is opened, i.e., interlocked, thereby preventing operation of the dispensing apparatus when the cover assembly is open.

As shown in FIG. 2, the means responsive to an input signal for energizing the actuating means includes means for activating the means for actuating the releasing means with electrical energy in response to the proximity of a portion of the body of the user without the body of the user contacting the dispensing apparatus. The activating means includes a source of electromagnetic radiation such as light, e.g. infrared light, from infrared light source 75 mounted in strut 76 extending downwardly from gear box 58. The strut extends through passage 42j of support 42. Infrared light source 75 can comprise a light emitting diode (LED). A beam of infrared light 77 is directed toward an infrared sensor or receiver 78 which can comprise a phototransistor. As shown in FIG. 3, the fingers of a user interrupt beam 77 of electromagnetic radiation such as infrared radiation from IR source 75 when the hand of the user is placed beneath check valve 48 from which material is released through port 48d.

The dispensing apparatus further includes means responsive to the proximity of a portion of the body of a user without the portion of the body contacting the dispensing apparatus for enabling the means for activating the means for actuating the releasing means with electrical energy. The enabling means comprises a sensor of ambient light which is mounted upon printed circuit board 80 extending from gear box 58. As shown in FIG. 3, the positioning of the fingers of the user beneath sensor 79 reduces the level of ambient light to which the sensor is exposed. Accordingly, the sensing of the change in ambient light by sensor 79 can be used to activate the circuitry 74 (FIG. 11) of the dispensing apparatus which includes the means for activating the means for actuating the releasing means. Phototransistor 81, resistors 82, 83, and 84, capacitors 85, 86 and 87, and integrated circuit 88 form a differential comparator having a predetermined time constant. By way of example, the time constant can be approximately five seconds. Phototransistor 81 can comprise an MRD370 phototransistor. Integrated circuit 88 can comprise a TLC251 integrated circuit. The circuit is always in an energized state with phototransistor 81 constantly sensing thet level of ambient light adjacent the dispensing apparatus. The phototransistor 81 is always energized; however, ambient light keeps its collector-emitter circuit turned off with the result that the input to integrated circuit 88 is low. When phototransistor 81 senses a sharp change in the ambient light level as when a user places his hands beneath the dispenser apparatus, the input to integrated circuit 88 from phototransistor 81 goes high. As a result, the output of integrated circuit 88 goes high.

The infrared light source 75 comprises LED 89. Integrated circuits 90 and 91, resistors 92, 93, 94 and 95 as well as capacitor 96 which are connected to transistor 97 which in turn drives the light emitting diode or LED 89. By way of example, each of integrated circuits 90 and 91 can comprise one-quarter of a quadruple 2-input positive nand gate, such as a 74HC00. Further by way of example, the light emitting diode 89 can be a TL906-1. Transistor 97 in series with the LED 89 can, by way of example, be an MPSA13. Due to the feedback of capacitor 96 and integrated circuits 90 and 91, the input signal to transistor 97 is a series of pulses. In turn, transistor 97 drives LED 89 to produce light pulses.

When integrated circuit 88 goes high, it also enables capacitor 98 by way of integrated circuits 99 and 100. Each of integrated circuits 99 and 100 can be one-quarter of a quadruple 2-input positive nand gate with open collector output, by way of example, a 74HCO3.

The infrared light beam 77 from LED 89 by being pulsed is distinct from any stray infrared light adjacent the dispensing apparatus. The pulsed infrared light beam 77 is received by infrared sensor receiver 78 which can comprise a phototransistor 101. By way of example, phototransistor 101 can be a TIL414 phototransistor. When phototransistor 101 receives pulsed infrared beam 77, it holds capacitor 98 discharged by means of integrated circuits 102 and 103 and resistor 103a. If pulsed infrared beam 77 applied by LED 89 to phototransistor 101 is interrupted by the hand of a user as shown in FIG. 3, capacitor 98 commences to charge by means of resistor 105. The charging of capacitor 98 exceeds the input threshold at the inputs 106a and 106b of integrated circuit 106. By way of example, integrated circuit 106 may be a quadruple 2-input positive nand gate, such as a 74HC00. As a result, the output of integrated circuit 106 connected through capacitor 107 goes low. The low output of integrated circuit 106 causes the output of the integrated circuit 108 to go high for a time period determined by resistor 109 and capacitor 110. When the output of integrated circuit 108 is high, it drives transistor 111 to an on condition which in turn switches motor 56 on. Cam 60 thereafter causes switch 62 to close, thereby shorting out transistor 111 for a time period determined by the high portion 60a of the cam.

In summary, ambient light or approach sensor 79 comprising phototransistor 81 disables infrared transmitter, i.e., LED 89 and holds capacitor 98 discharged as long as a user does not approach the dispensing apparatus. In this way, the energy of the battery power supply is conserved. If the user approaches the dispensing apparatus and places his or her hand near ambient light sensor 79, i.e., phototransistor 81, the phototransistor 81 is turned on an enables the infrared transmitter LED 89 to transmit infrared pulses which form beam 77. If the interruption of ambient light is simply transient phototransistor 81 returns to the quiescent state. When the user's hand remains adjacent the dispenser and interrupts beam 77 adjacent infrared receiver 78 comprising phototransistor 101, integrated circuits 99 and 100 then enabling capacitor 98 to be charged. When phototransistor 101 receives infrared pulses from LED 89, it discharges capacitor 98. When the user interrupts infrared beam 77 to phototransistor 101, capacitor 98 can then charge. When capacitor 98 charges to a point approaching the output of integrated circuit 101, integrated circuit 106 goes low and integrated circuit 108 goes high, thereby turning on transistor 111 to turn on motor 56. Capacitor 110 and resistor 109 see a sharp change. As a result, the integrated circuit 108 is high for a brief period of time which, by way of example, can be 300 milliseconds. Capacitor 110 prevents recycling of motor 56 until the hand of the user is removed from adjacent infrared receiver 101.

It can be understood that circuit 74 of the invention enables the dispensing apparatus to be operated with batteries such as dry cells or primary batteries because of the low power consumption resulting from the fact that the circuit is substantially turned off until the approach of a user. Thus, ambient light at phototransistor 81, the approach sensor, prevents the operation of the LED transmitter 89. In the absence of pulsed infrared beam 77 at phototransistor 101, the portion of circuit 74 for driving transistor 111 is similarly deenergized. Only the response of the approach sensor, phototransistor 81, to the approach of a user initiates the infrared transmitter, LED, 89 and only the interruption of the infrared beam to phototransistor 101 can result in the circuit turning on transistor 111 to drive motor 56. As a result, the battery power supply which is integrated with the disposable container is sufficient to operate the dispenser for the number of operations required to dispense the entire contents of the container.

The location of receptacle or tube 44 a shown in FIG. 6 at one of the four locations in alignment with openings 43c enable a disposable container assembly 43 to be conditioned or coded to release its contents only in a dispensing apparatus in which the contacts 69c and 71 are positioned to connect to the batteries within one of receptacles 44. In the construction shown in FIG. 6, the four available positions for receptacles 44 provide four different coded selections. The arrangement of coding the dispensing apparatus and disposable containers can provide a means for enabling only an authorized container to be used with a given dispensing apparatus. The optional four coded selections can be increased to eight in the example of FIG. 6 if the batteries are reversed in polarity and the circuitry of the dispensing apparatus is electrically polarized.

In FIGS. 12 and 13, there is shown another embodiment of the invention in which a disposable container assembly can be conditioned to operate with a predetermined selection of dispensing apparatus 112. As shown in FIG. 12, diepsensing apparatus 112, has a support 112a with a horizontal plate 112b upon which bottom portion 113a of casing 113 is mounted. On horizontal plate plate 112b, there is disposed a plurality of contacts 114 which, by way of example, can be three rows of three contacts 114. Disposable container assembly 111 contains one receptacle 115 having batteries 116.

As shown in FIG. 13, a contact 117 which is similar to door contact 72 shown in FIG. 4 has portion 117a connected to batteries 116 and portion 117b adapted to be connected by lead 118 to a predetermined one of contacts 114. Printed circuit board 119 for the control circuit of the dispensing apparatus is connected by lead 120 to a different predetermined one of contacts 114. In addition, printed circuit board 119 is connected to contact 121 having portion 121a in connection with battery 116. As shown in FIG. 12, bottom portion 113a of the container assembly 111 is provided with a pattern 122 formed by conductive material such as a printed circuit conductive ink or the like which is shaped to connect the predetermined contact 114 to which lead 118 is connected and the predetermined contact 114 to which lead 120 is connected. As a result, when the disposable container assembly 111 is placed upon horizontal plate 112b of the support of the dispensing apparatus, conductive pattern 122 completes the circuit from battery 116 to printed circuit board 119. It can be understood that the various permutations of the plurality or array of contacts 114b require a plurality of different patterns, each of which has a corresponding different conductive pattern 122.

In FIG. 13, lead 120a can be connected to any one of contacts 114, other than those to which pattern 122 is adapted to connect. If one attempted to defeat the coding provided by pattern 122 by placing a conductive sheet (e.g. metal foil) across the array of contacts 114, the lead 120a would short or short circuit circuit board 119, thereby preventing operation of the dispensing apparatus.

Figure 15:
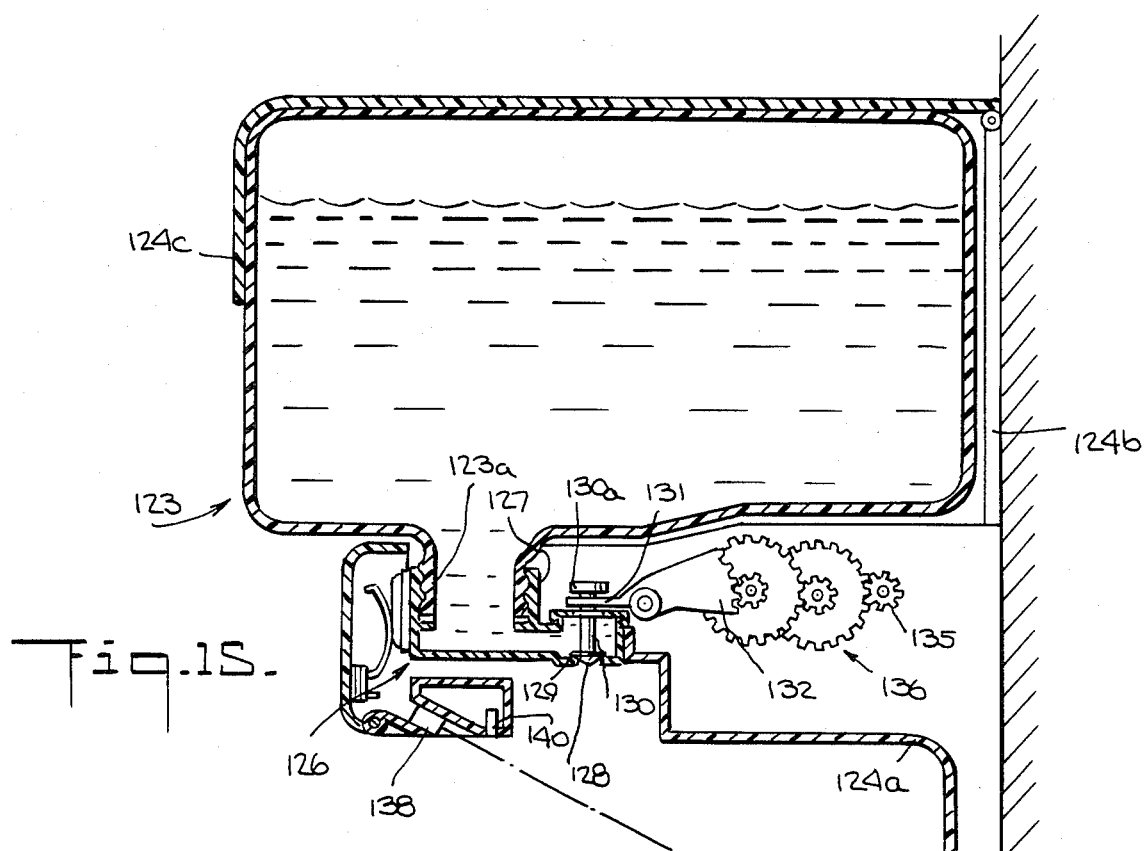
FIG. 15 is a vertical section of the dispensing apparatus of FIG. 14 showing the releasing valve with the disposable container and means for actuating the releasing valve.
Figure 14:
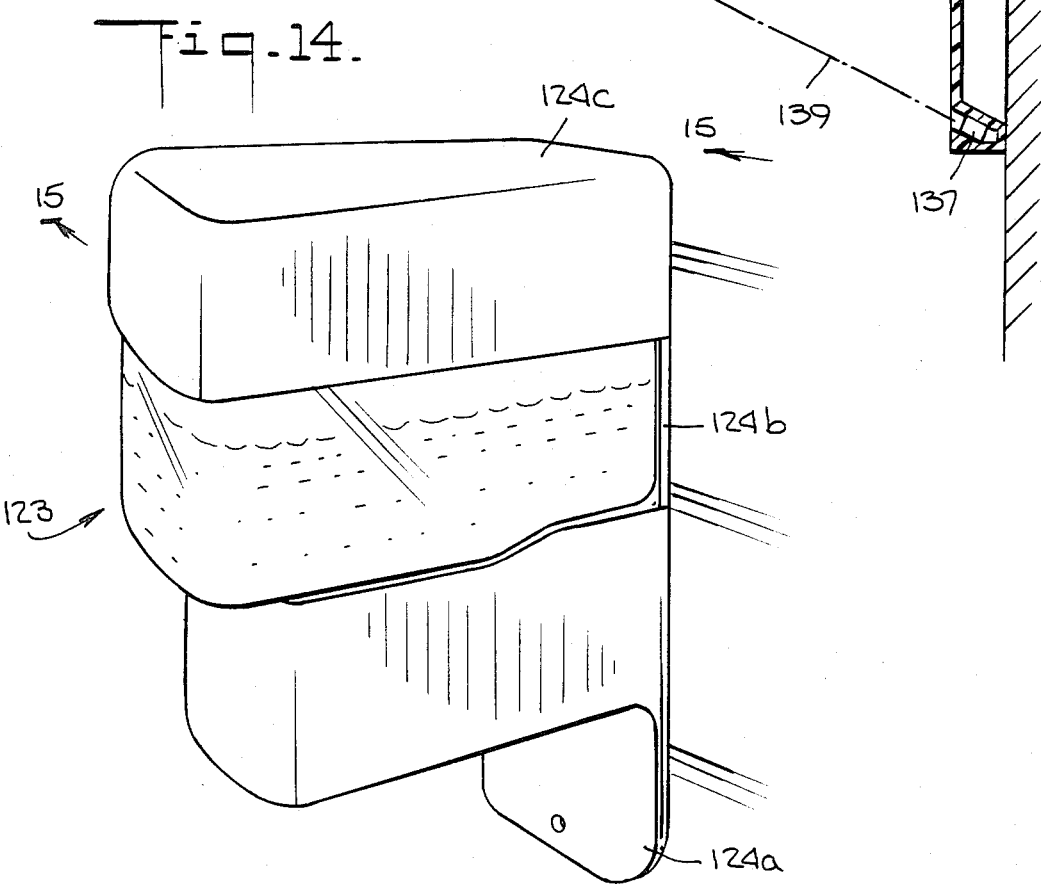
FIG. 14 is a perspective view of the exterior of another embodiment of the dispensing apparatus of the invention.

In FIGS. 14 and 15, there is shown another embodiment of disposable container assembly 123 of the invention. The disposable containers assembly is adapted to be mounted upon a dispensing apparatus 124 comprising base portion 124a adapted to be mounted on wall 125 and having support 124b extending from the base portion 124a to cover 124c.

Figure 16:
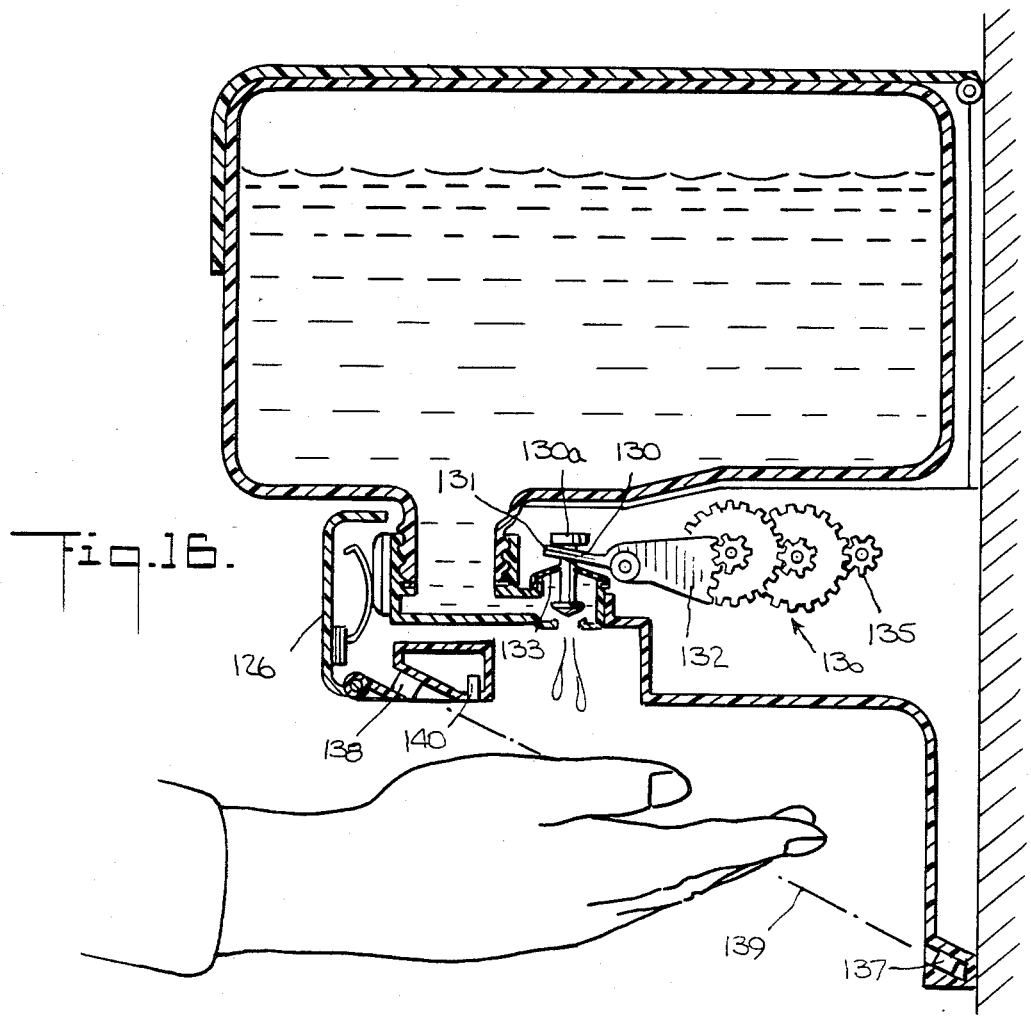
FIG. 16 is a vertical section of the dispensing apparatus of FIG. 14 showing a predetermined amount of liquid material being dispensed in response to the hand of a user interrupting the radiation extending from a source toward a sensing element.

As shown in FIG. 19, the releasing valve assembly 126 which is adapted to be integrated with disposable container assembly 123 comprises threaded inlet portion 127 which is adapted to be engaged with threaded neck 123a of the container assembly. As shown in FIG. 15, release valve assembly 126 includes poppet valve 128 which in its closed position, as shown in FIG. 15, bears upon seat 129. Stem 130 of the poppet valve is provided with shoulder 130a which is engaged by fork 131 connected to sector gear 132. The poppet valve is biased downwardly as shown in FIG. 15 by a resilient disk 133 which can be of elastomeric material. In FIG. 16, resilient disk 133 can be seen deflected upwardly in response to the lifting of the poppet valve by fork 131. It should be noted that resilient disk 133 serves the additional function of providing a seal between the moving poppet valve and release valve housing 126.

Figure 17:
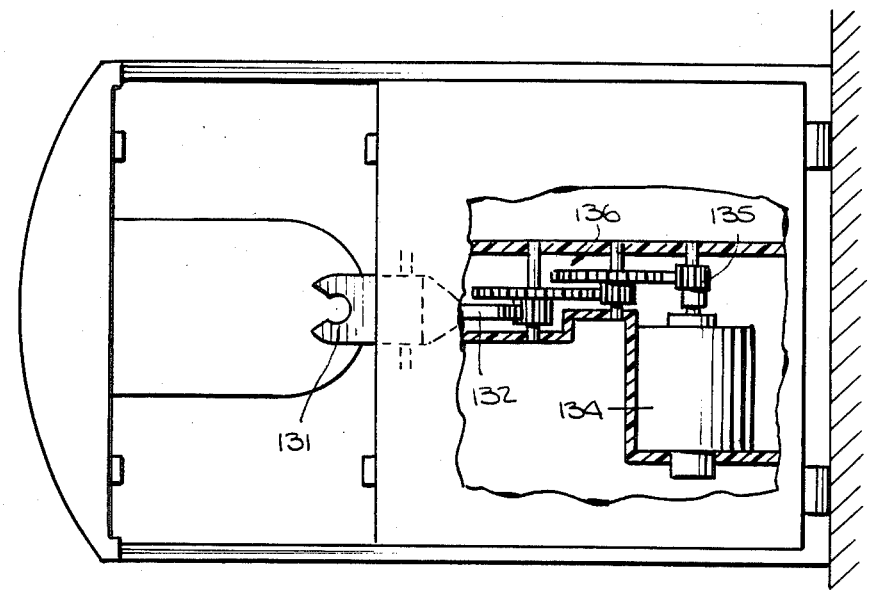
FIG. 17 is a fragmentary horizontal section of the dispensing apparatus of FIG. 14 showing the means for actuating the releasing valve.

As shown in FIG. 17, motor 134 drives pinion 135 which in turn drives reduction gear train 136, the output of which is connected to sector gear 132.

Figure 11:
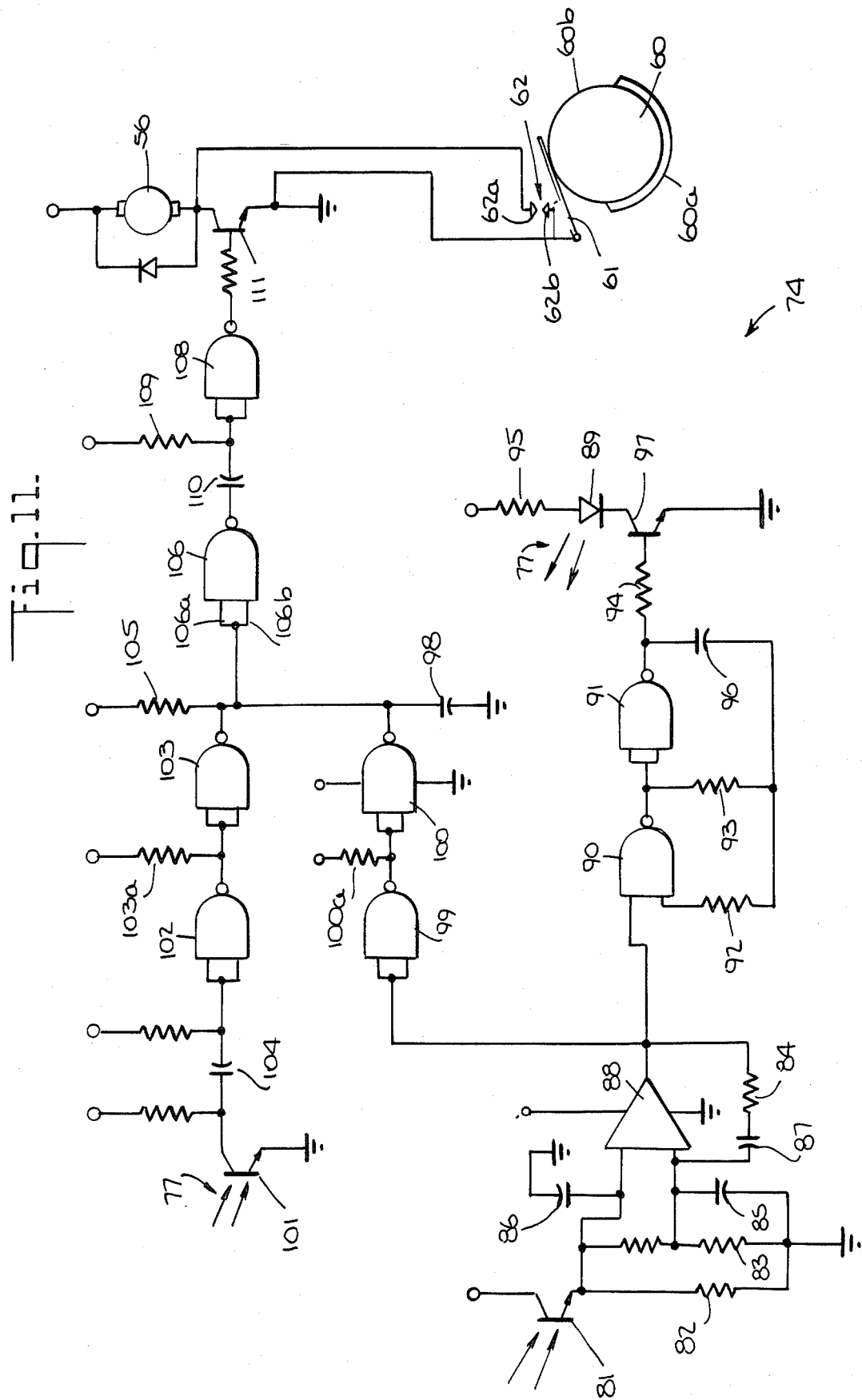
FIG. 11 is a schematic representation of the electrical circuit for energizing the actuating means of the dispensing apparatus.

The circuitry for sensing the proximity of the hands of the user can be similar to that shown of circuit 74 in FIG. 11 for use with dispensing apparatus 124. Thus, as shown in FIG. 15, there is provided a source of electromagnetic radiation, such as infrared light 137, which corresponds to infrared source 75 shown in FIG. 8. The receiver for the radiation from source 137 is infrared receiver 138 mounted in the release valve assembly 126. The pulsed beam 139 of infrared radiation as shown in FIG. 16 can be interrupted by the user's hand similarly as shown in FIG. 3. In addition, ambient light can be sensed by sensor 140 which is similar to ambient light sensor 79 described above. As in the case of sensor 79, sensor 140 in response to a reduced ambient light level, when the places his hands adjacent the dispensing apparatus, can energize the portion of circuit 74 which in turn energizes the infrared source 137 and the circuitry responsive thereto.

As shown in FIG. 20, when cover 124c is raised, disposable container assembly 123 can be inserted into the dispensing apparatus 124. Relief valve assembly which includes receptacles 126a is disposed between side walls 124d of the dispensing apparatus 124. As shown in FIG. 20, batteries 141 such as primary or dry cell batteries are disposed in receptacles 126a. When the disposable container assembly 123 is installed on the dispensing apparatus 124, door 124e can be closed. The door is provided with contacts 124f which abut batteries 141 within receptacles 126a. Circuitry not shown connects the batteries to the power supply of the control circuit similar to that of FIG. 11.

Here it should be noted that the circuitry of FIG. 11 provides for the energization of motor 56 to terminate when cam 60 is rotated from the position in which follower 61 is on high portion 60a of the cam to low portion 60b of the cam. In the embodiment shown in FIGS. 14-17, the electrical connection to motor 134 is opened when the position of sector gear 132 as shown in FIG. 16 has been reached. Thereafter the resilient or elastic force of resilient disk 133 can reverse the movement of sector gear 132 and return it to the position shown in FIG. 17 in which poppet valve 128 is closed.

In FIG. 22, there is shown dispensing apparatus 142 which includes a disposable dispensing container 143. Disposable container assembly 143 includes container 143a and cap 143b. Valve assembly 144 comprises valve body 144a which is connected by threads to neck 144c of container 143a. Valve rod 144b carries poppet valve 144c which engages valve seat 144d of the valve body 144a. The upper end of the valve rod is provided with shoulder 144e which engages spring 144f. The spring biases poppet valve 144c against the valve seat. The upper end of the valve rod 144b is also provided with shoulder 144g which is engaged by a fork-shaped lever 145. The lever which is pivotally mounted about shaft 146 includes a follower 147 which engages the lower surface of roller 148 as viewed in FIG. 22. Gear train 149 driven by motor 150 revolves roller 148 within a vertical plane which causes the follower 147 to move downwardly as the roller moves downwardly as viewed in FIG. 22 to elevate the fork-shaped lever 145, thereby raising valve rod 144b.

As shown in FIG. 23, disposable container assembly includes receptacles 151 attached to one another by plates 152 and 153 which are attached to valve body 144a. Each of the receptacles is adapted to carry at least one battery such as a primary battery or a dry-cell battery. Contacts 154 engage the end portion of each of the batteries within the receptacles.

In FIG. 24, there is shown the dispenser assembly 142 which includes support 142a. The support engages adapter 142b for mounting the dispensing assembly with respect to a vertical wall. Support 142a carries base 142c which contains well 142d having opening 142e through which the valve body 144a can extend. The well also contains electrical contacts 155 in engagement with the ends of the batteries within receptacles 151 which are disposed opposite contacts 154. Spacer 142f mounted upon adapter 142b supports frame 142g which carries motor 150, gear train 149 and fork-shaped lever 145. In FIG. 23, cover 142h of the dispenser assembly is shown in its raised position in which it is adapted to enable the disposable container assembly 143 to be installed.

Motor 153 can be operated by circuitry similar to that shown in FIG. 11. Thus, the dispensing apparatus shown in FIG. 22 includes an infrared source 156 for directing a beam of infrared energy 157 toward infrared receiver 158. The dispensing apparatus 142 shown in FIG. 22 also includes proximity sensor 159 which operates similarly as proximity sensor 79 shown in FIG. 2. The proximity sensor 159 activates the circuitry as heretofore discussed above with respect to circuit 74 in FIG. 11, and infrared sensor 158 in response to the interruption of beam 156 by the user's hands, actuates the operations of the dispensing apparatus.

Figure 25:
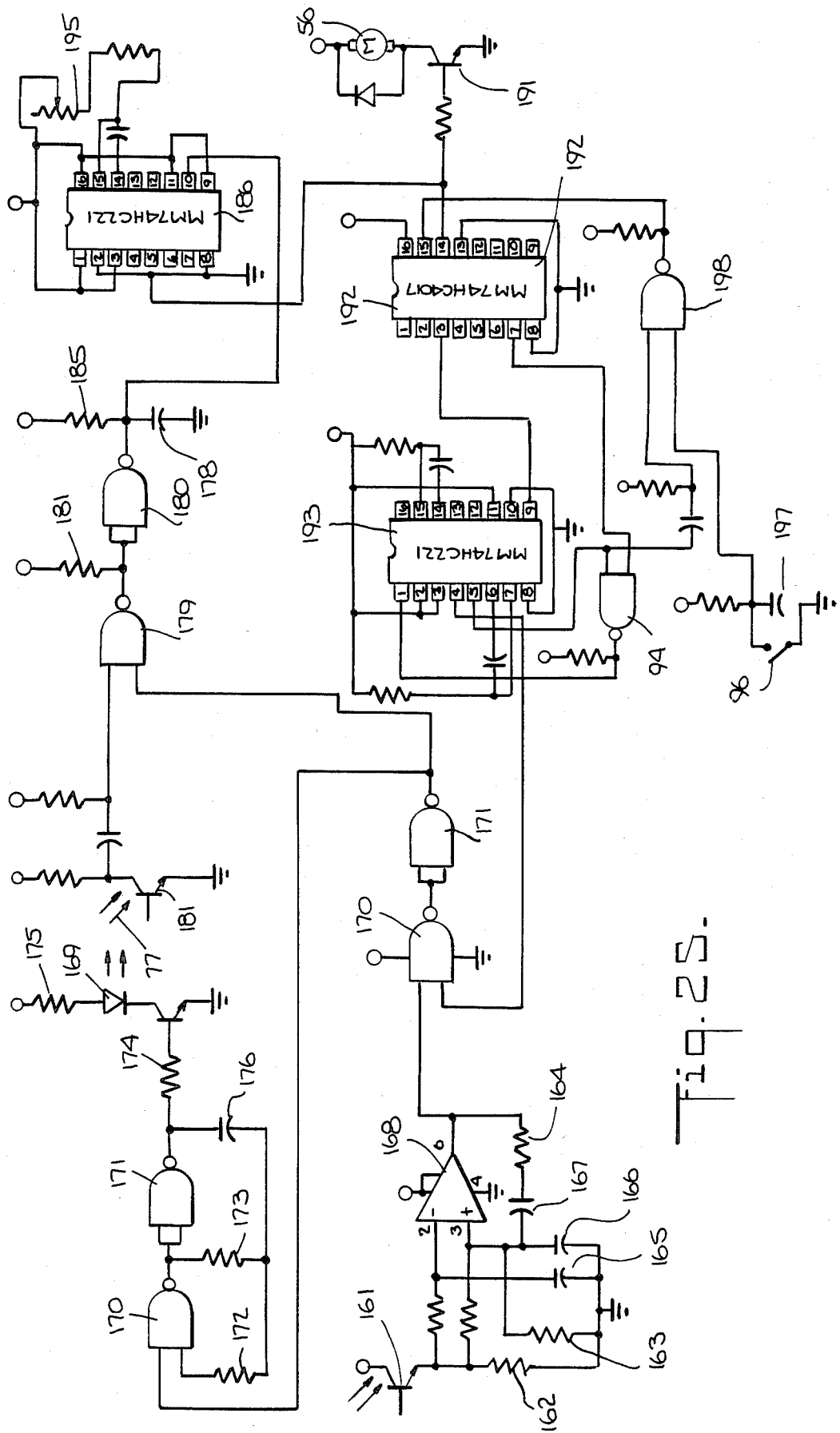
FIG. 25 is a schematic representation of another embodiment of the electrical circuit for energizing the actuating means of the dispensing apparatus.

Another embodiment of the circuitry of the invention is shown in FIG. 25. As shown in FIG. 3, the positioning of the fingers of the user beneath sensor 79 reduces the level of ambient light to which the sensor is exposed. Accordingly, the sensing of the change in ambient light by sensor 79 can be used to activate the circuitry 75 (FIG. 25) of the dispensing apparatus which includes the means for activating the means for actuating the releasing means. Phototransistor 161, resistors 162, 163 and 164, capacitors 165, 166 and 167, integrated circuit 168 form a differential comparator having a predetermined time constant. By way of example, the time constant can be approximately five seconds. Phototransistor 161 can comprise an MRD370 phototransistor. Integrated circuit 168 can comprise a TLC251 integrated circuit. The circuit is always in an energized state with phototransistor 161 constantly sensing the level of ambient light adjacent the dispensing apparatus. The phototransistor 161 is always energized; however, ambient light keeps its collector-emitter circuit turned off with the result that the input to integrated circuit 168 is low. When phototransistor 161 senses a sharp change in the ambient light level as when a user places his hands beneath the dispensing apparatus, the input to integrated circuit 168 from phototransistor 161 goes high. As a result, the output of integrated circuit 168 goes high.

The infrared light source 75 comprises LED 169. By way of example, LED source 169 can comprise a TIL906-1 light emitting diode. Nand gates 170 and 171, resistors 172, 173, 174 and 175 as well as capacitor 178 are connected to transistor 177. Transistor 177 in turn drives the light emitting diode or LED 169. By way of example, each nand gate 170 and 171 can comprise one-quarter of a quadruple 2-input positive nand gate, such as a 74CH00. Transistor 177 in series with the LED 169 can, by way of example, by a 2N2222. Due to the feedback of capacitor 175 and nand gates 170 and 171, the input signal to transistor 177 is a series of pulses. In turn, transitor 177 drives LED 168 to produce light pulses.

When integrated circuit 168 goes high, nand 170 goes low, nand 171 goes high, nand 179 goes low and nand 180 goes high. This enables capacitor 178. Each of integrated circuits 179 and 180 can be one-quarter of a quadruple 2-input positive nand gate with open collector output, such as a 74HC03.

The infrared light beam 77 from LED 169 by being pulsed is distinct from any stray infrared light which may be received by infrared sensor receiver 78 which can comprise a phototransistor 181. By way of example, phototransistor 181 can be a TIL414 photoransistor. When phototransistor 181 receives pulsed infrared beam 77, it holds capacitor 178 discharged by means of nand gates 179 and 180, integrated circuits 102 and 103, and resistor 181.

If pulsed infrared beam 77 applied by LED 169 to phototransistor 181 is interrupted by the hand of a user as shown in FIG. 3, capacitor 178 commences to charge by means of resistor 183. The charging of capacitor 178 provides an input to pin 10 of retriggerable monostable multivibrator with clear 186, which, by way of example, can be a MM74C221. In response to the input at pin 10, an output pulse at pin 5 is coupled to transistor 191 which is thereby turned on to drive motor 56.

The drive signal for motor 56 from pin 5 of monostable multivibrator 186 to transistor 191 is also coupled to pin 14 of a programmable modulo-N decade counter 192, which for example, can comprise a MM 74 HC 4017. Thus the motor drive signal provides a clock input pulse to the decade counter 192 at pin 14. The output of the decade counter 192 is pin 3 which is normally high. When the clock input comes in, pin 3 goes low. By way of pin 9 of monostable multivibrator 193, the clock input triggers a first monostable timer which is one-half of the retriggerable monostable multivibrator with clear 193, such, for example, a MM74HC221. The first timer has a time period of approximately 5.6 seconds, for example.

During that time period when the first timer goes high, the decade counter 191 will count any input of motor drive pulses which it receives at pin 14. If the decade counter 191 receives more than, for example, three pulses in a predetermined period of time, such as 5.6 seconds, during which the first timer is on, the decade counter 191 causes a second timer in monostable multivibrator 193 to fire which is the other half of monostable multivibrator 193. The second timer is fired by a nand gae 194. Nand gate 194 can be one-quarter of a quadruple 2-input position nand gate, for example a 74HC03. Thus, pin 7 of decade counter 192 is connected to one input of nand gate 194 and pin 5 of monostable multivibrator 193 is connected to the other input of nand gate 194. When nand gate 194 fires, it provides a delay pulse by means of the second timer of monostable multivibrator 193. Thus the output of nand gate 194 is connected to pin 1 of monostable multivibrator 193. The output of the second timer at pin 4 is connected as an input along with the approach sensor input signal from comparator 168 into nand 170. As a result, the second timer of monostable multivibrator 193 will provide a timing period delay of about fifteen seconds during which the dispensing apparatus can not be triggered. This time duration can be made to be adjustable. In this way the dispensing device can be protected against improper use where a user would repeatedly interrupt the sensing beam in a short period of time to case a number of closely spaced dispensing cycles.

Monostable multivibrator 195 has a variable resistor or potentiometer 195 to enable the drive pulse to motor 56 to be adjusted in length and thereby the time duration of the dispensing cycle. Thus by means of adjusting the time duration of the drive signal to motor 56, the duration of a dispensing cycle can be controlled. By way of example, a typical period for the drive signal of motor 56 can be selected to be from about ½ second to about one and one-half seconds. Similarly the time cycle of each of the two timers of monostable multivibrator 193 can be provided with potentionators for setting their respective time cycles.

In summary when the input pulse to motor 56 goes high, pin 14 of the counter 192 goes high. Pin 3 which is the zero output of the decade counter is normally high; however it will go low when the counter 192 is pulsed at pin 14. When pin 3 goes low, the first timer of half of the monostable multivibrator 193 will go on for approximately 5.6 seconds. During this period that the first half is on, if the decade counter 192 receives more than three pulses at pin 14, pin 7 of the counter will go high. When pin 7 of the counter 192 goes high, it is coupled through an open collector nand gate 194 to which is collected the first timer having the 5.6 second time period. If both of those conditions are arrived at, i.e., the inputs to nand 194 are both high at the same time, then the output of the nand gate 194 will go high and fire the second timer of nonstable multivibrator 193 which is the delay timer. When the delay timer goes high, its output at pin 4 disables the approach sensor nand gate 170. Thereafter for a period of approximately fifteen seconds, the delay period, the dispensing unit can not be actuated. At the end of fifteen seconds, the circuit resets back to normal and thereafter can be actuated to dispense. Accordingly, excessive cycling of the dispenser is prevented and yet after the fifteen second delay period, the dispenser is reset for proper use.

Switch 196 when it is in a grounded position short circuits capacitor 197. Nand gate 198 connects capacitor 197 to pin 15 of counter 191. The timer monostable multivibrator 193 can still go on, but the counter 191 fires the counter reset, thereby keeping the counter reset high so it can not count. Thus the counter circuitry can be disabled by switch 194.

Figure 26:
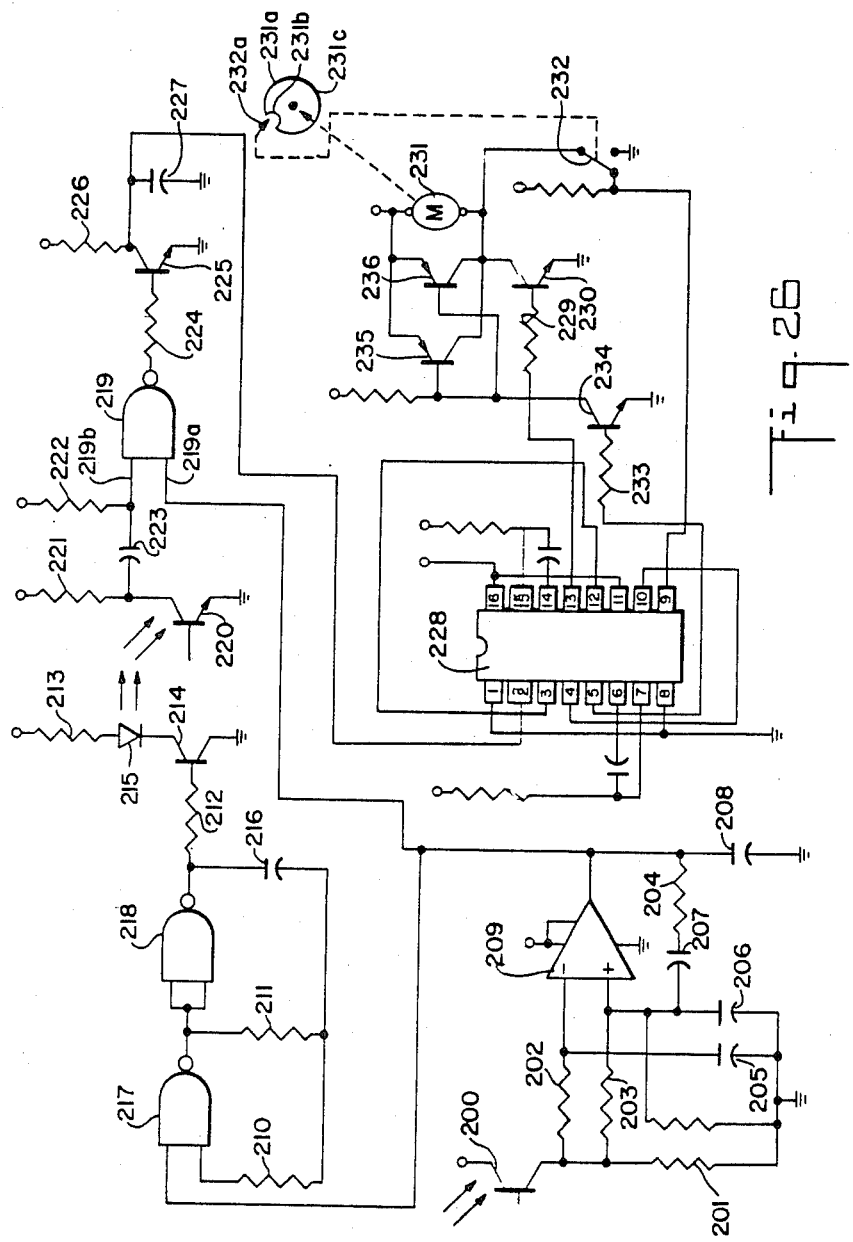
FIG. 26 is a schematic representation of still another embodiment of the electrical circuit for energizing the dispensing apparatus in which the motor is braked to a stopped position.

In FIG. 26, there is shown an other embodiment of the electrical circuitry for the dispensing apparatus of the invention. Phototransistor 200, resistors 201, 202, 203, and 204, capacitors 205, 206, 207 and 208, along with integrated circuit 209, form a differential comparator with an on-time constant, for example, of approximately five seconds. Phototransistor 200 senses the ambient light level at the dispensing apparatus. When the phototransistor 200 senses a reduction in light in response to the placing of the hand of a user adjacent to the phototransistor in the dispensing apparatus, the output of integrated circuit 209 goes high.

This condition enables an infrared transmitter circuit which includes resistors 210, 211, 212 and 213, transistor 214, light emitting diode 215, capacitor 216, and two quarters 217 and 218 of an integrated circuit which can be a quadruple 2-input positive nand gate, such for example, a 74HC00. When the output of integrated circuit 209 goes high, it also causes input 219a of integrated circuit 219 to go high thereby enabling light emitting diode or infrared transmitter 215 to emit a stream of infrared pulses as shown by the arrows in FIG. 26. The infrared pulses are sensed by phototransistor 220 which is connected to an infrared receiver circuit including resistors 221 and 222, and capacitor 223.

A response of phototransistor 220 to infrared pulses causes pulses to be applied to capacitor 223 and thereby to input 219b of integrated circuit 219. Integrated circuit 219 can be one-quarter of a 2-input positive nand gate, such for example, a 74HC00. Thus, input 219b goes alternately high and low with each pulse. The output of integrated circuit 219 is coupled through resistor 224 to transistor 225. Transistor 225 has its collector connected to resistor 226 and capacitor 227. The pulses from integrated circuit 219 applied to the base of transistor 225 causes capacitor 227 to be held in a discharged state.

If the infrared pulses from LED 215 being applied to phototransistor 220 are interrupted by the hand of a user adjacent to the dispensing apparatus, the input of 219b goes high while the output from integrated circuit 209 connected to input 219a of integrated circuit 219 remains high. The output of integrated circuit 219 then goes low, causing transistor 225 to turn off and thereby allowing capacitor 227 to charge. When the voltage on capacitor 227 reaches the threshold of pin 2 of integrated circuit 228, pin 13 of integrated circuit 228 goes high. Integrated circuit 228 is a dual monostable multivibrator which can be, by way of example, and MM74HC221. Pin 13 of integrated circuit 228 is coupled by resistor 229 to the base of transistor 230. When pin 13 goes high, it turns on transistor 230, thereby causing motor 231 to turn on.

At the same time, pin 4 of integrated circuit 228 goes low, thereby causing pin 10 of integrated circuit 228 to go low. After a predetermined period of time, the low at pin 10 disables pin 13 of integrated circuit 228 and causes pin 13 to go low. Thus, the output from pin 12 of integrated circuit 228 stays high for the predetermined period of time which, for example, can be approximately 300 milliseconds. This predetermined period of time allows motor 231 to start even though cam switch 232 is in the position shown in FIG. 26 in which switch 232 is connected to motor 231 and the follower 232a for the cam switch 232 is in low portion 231b of cam 231a.

Starting of the motor 231 causes rotation of the cam 231a connected to the motor. Cam 231a operates cam switch 232 by moving it from the position shown in FIG. 26 to the alternate position of the switch in which it is connected to ground and in which high portion 231c of cam 231a engages follower 232a. In this way, cam switch 232 maintains motor 231 energized. After a revolution of the cam 231a by motor 231, follower 232a enters low portion 231b of cam 232 and switch 232 then returns to its original position shown in FIG. 26. Pin 9 of integrated circuit 228 is thereby caused to go low. This in turn causes pin 5 of integrated circuit 228 to go high for a time period which, by way of example, can be approximately 300 milliseconds. By means of resistor 233, the high at pin 5 of integrated circuit 228 turns on transistor 234 which in turn switches on transistors 235 and 236. In this way, transistor 236 shorts out the armature of motor 231 thereby inducing dynamic braking within the motor which immediately stops the rotation of motor 231. Thus it can be seen that the circuitry of FIG. 26 by means of the braking of motor 231 provides a positively determined stopped or rest position for motor 231 after the dispensing cycle has been completed. In this way, the circuitry positions motor 231 to be ready for the next dispensing cycle.

What is claimed is:

1. An apparatus for dispensing flowable material comprising:
   a disposable container for holding flowable material to be dispensed,
   releasing means integrated with the container for releasing a predetermined amount of flowable material from the disposable container when the releasing means is actuated, said releasing means including an elongated chamber connected at one end portion thereof to the interior of the container with the end portion of the chamber having an opening therein, said chamber having a deformable wall portion disposed between its end portions,
   actuating means when electrically energized for displacing the deformable wall portion of the chamber for dispensing the flowable material, said actuating means including a pad disposed adjacent the deformable wall portion, a pivotably mounted lever for supporting the pad and an electrical motor coupled to the lever for moving the pad between a rest position and an operating position in which the pad displaces the deformable wall portion of the chamber; and
   means engaged with the pivotably mounted lever for deenergizing the electrical motor when the pad supported by the pivotably mounted lever is substantially in the operating position.

2. An apparatus for dispensing flowable material having a disposable, flexible container for holding flowable material to be dispensed, releasing means integrated with and disposable with the container for releasing a predetermined amount of flowable material from the disposable container when the releasing means is actuated, a disposable jacket in which is disposed said flexible container, said releasing means extending through a wall of the jacket so as to be located outside said jacket so that said releasing means can be actuated, actuating means when electrically energized for actuating the releasing means to release the predetermined amount of material and energizing means responsive to an input signal for energizing the actuating means; characterized in that at least one disposable receptacle is disposed within the jacket adjacent to, and disposable with the jacket and container, said receptacle receiving at least one electrical battery to electrically energize the dispensing apparatus and in which the apparatus further comprises means for providing an electrical connection to the at least one receptacle through a wall of said jacket.

3. The apparatus in accordance with claim 2, characterized in that there is a plurality of disposable receptacles disposed adjacent to, and disposable with the disposable container, a predetermined fraction of the receptacles, less than one, being adapted to contain electrical batteries sufficient to electrically energize the apparatus for dispensing, and in which the means for providing an electrical connection to the at least one receptacle is adapted to be connected only to the predetermined fraction of the receptacles for transmitting electrical energy to the apparatus.

4. The apparatus in accordance with claim 3, characterized in that the disposable container is one of a plurality of different disposable containers and in which different predetermined fractions, less than one, of the plurality of receptacles being adapted to contain electrical batteries corresponds to a container which is a different predetermined one of the plurality of different disposable containers.

5. The apparatus in accordance with claim 2 in which the energizing means responsive to an input signal for energizing the actuating means comprises photoelectric means for activating the actuating means with electircal energy in response to the proximity of a portion of the body of a user of the dispensing apparatus adjacent said photoelectric means without the portion of the body of the user contacting the dispensing apparatus, further charcterized by enabling means responsive to the proximity of a portion of the body of a user of the dispensing apparatus without the portion of the body of the user contacting the dispensing apparatus for enabling the photoelectric means so that the actuating means will actuate the releasing means in response to the proximity of a portion of the body of a user adjacent said photoelectric means.

6. The apparatus in accordance with claim 5 in which the photoelectirc means is deenergized prior to being enabled by the enabling means, to thereby reduce the consumption of electrical energy.

7. A disposable device for holding flowable material which is to be released by a dispensing apparatus having an electrically energized actuating means, said disposable device comprising structure for forming a disposable, flexible container for holding flowable material to be dispensed, the container having an opening extending into the interior of the container, releasing means integrated with the container disposed adjacent the opening therein for releasing a predetermined amount of flowable material from the disposable container when the releasing means is actuated by the electrically energized actuating means, a disposable jacket in which is disposed said flexible container, further characterized by structure forming at least one receptacle disposed within the jacket adjacent to, and disposable with the container for receiving at least one electrical battery in the receptacle to electrically energize a dispensing apparatus having means for providing an electircal connection to the at least one receptacle, said jacket including means for permitting said electrical connection to be made to said at least one receptacle within the jacket.

8. The disposable device for holding flowable material in accordance with claim 7 characterized in that there is a plurality of receptacles disposed adjacent to, and disposable with the disposable container, a predetermined fraction of the plurality of receptacles, less than one, being adapted to contain electrical batteries sufficient to electrically energize the apparatus for dispensing, and in which the means for providing an electrical connection to the at least one receptacle is adapted to be connected only to the predetermiend fraction of the receptacles for transmitting electrical energy to the apparatus.

9. A system for initiating operation of a dispensing apparatus in response to the proximity of a portion of the body of a user of the dispensing apparatus without the portion of the body of the user contacting the dispensing apparatus, the dispensing apparatus having actuating means for dispensing material when electrically energized, comprising activating means for activating the actuating means with electrical energy, said activating means including sensing means adapted to be mounted on the dispensing apparatus for sensing electromagnetic radiation applied thereto when said activating means is enabled, and means responsive to a change in electromagnetic radiation sensed by the sensing means when the activating means is enabled and a portion of the body of a user is proximate to the sensing means without the portion of the body of the user contacting the dispensing apparatus for applying electrical energy to the actuating means, characterized by enabling means adapted to be mounted on the dispensing apparatus and responsive to the proximity of a portion of the body of a user of the dispensing apparatus to the enabling means without the portion of the body of the user contacting the dispensing apparatus for enabling the activating means.

10. The system in accordance with claim 9 in which the enabling means comprises detecting means mounted on the dispensing apparatus for detecting a change in ambient light applied thereto when a portion of the body of a user is proximate to the dispensing apparatus without the portion of the body of the user contacting the dispensing apparatus, the detecting of a change in ambient light by the detecting means enabling the activating means.

11. The system in accordance with claim 9 characterized in that the activating means is deenergized prior to being enabled by the enabling means to thereby reduce the consumption of electrical energy.

12. The system in accordance with claim 9 characterized in that the enabling means comprises detecting means for detecting a change in ambient light applied thereto when a portion of a hand of a user is proximate to the detecting means, said enabling means enabling the activating means upon the detection of a change in ambient light.

13. The system in accordnace with claim 9 characterized in that the enabling means for enabling the activating means enables said activating means for a predetermined period of time.

14. The system in accordance with claim 9 further characterized by means responsive to the occurrence of a predetermined number of actuations by the actuating means within a predetermined time interval for preventing operation of the actuating means subsequent to the occurrence.

15. An system in accordance with claim 14 characterized in that the means responsive to the occurrence of a predetermined plurality of input signals within a predetermined time interval for preventing operation of the actuating means comprises means for timing the extent of the predetermined interval, means for counting the plurality of input signals, and means for determining the counting of the predetermined plurality of input signals within the timing of the predetermined interval for preventing operation of the actuating means.

16. The system in accordance with claim 14 further characterized by means responsive to the means for preventing operation of the actuating means subsequent to the occurrence for enabling operation of the actuating means after the passage of a redetermined time period from the time of preventing operation.

17. An apparatus for controlling the operation of a device for dispensing material having releasing means for releasing material to be dispensed and actuating means for actuating the releasing means to release the material characterized by means responsive to an input signal for actuating the actuating means for a predetermiend cycle of operation of the releasing means; and disabling means responsive to the occurrence of a predetermined number of input signals within a predetermined time interval for preventing operation of the actuating means subsequent to the occurrence.

18. The apparatus in accordance with claim 17 which the disabling means is characterized by means for timing the extent of the predetermined interval, means for counting the plurality of input signals, and means for determining the counting of the predetermined plurality of input signals within the timing of the predetermined interval for preventing operation of the actuating means.

19. The apparatus in accordance with claim 17, further characterized by enabling means responsive to the means for preventing operation of the actuating means subsequent to the occurrence for enabling operation of the actuating means after the passage of a predetermined time period from the time of preventing operation.

20. An apparatus for dispensing flowable material having a disposable container for holding flowable material to be dispensed, means integrated with the container for releasing a predetermined amount of flowable material from the disposable container when the releasing means is actuated, actuating means when electrically energized for actuating the releasing means to release the predetermiend amount of material, said actuating means comprising an electrical motor, further characterized by braking means responsive to the advancement of the motor for braking said motor after the release of a predetermined amount of material.

21. The apparatus in accordance with claim 20 in which the means for braking the electrial motor comprises means for dynamically braking the electrical motor.

* * * * *